US012641827B2

(12) United States Patent
Sharma et al.

(10) Patent No.: US 12,641,827 B2
(45) Date of Patent: May 26, 2026

(54) TRIM PATTERNING FOR FORMING ANGLED TRANSISTORS

(71) Applicant: Intel Corporation, Santa Clara, CA (US)

(72) Inventors: Abhishek A. Sharma, Hillsboro, OR (US); Tahir Ghani, Portland, OR (US); Anand S. Murthy, Portland, OR (US); Elliot Tan, Portland, OR (US); Shem Ogadhoh, West Linn, OR (US); Sagar Suthram, Portland, OR (US); Pushkar Sharad Ranade, San Jose, CA (US); Wilfred Gomes, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 17/935,652

(22) Filed: Sep. 27, 2022

(65) Prior Publication Data

US 2024/0105798 A1    Mar. 28, 2024

(51) Int. Cl.
| | |
|---|---|
| *H10D 30/67* | (2025.01) |
| *H10D 30/43* | (2025.01) |
| *H10D 30/62* | (2025.01) |
| *H10D 84/01* | (2026.01) |
| *H10D 84/83* | (2025.01) |

(52) U.S. Cl.
CPC ......... *H10D 30/6735* (2025.01); *H10D 30/43* (2025.01); *H10D 30/62* (2025.01); *H10D 30/6757* (2025.01); *H10D 84/0158* (2025.01); *H10D 84/834* (2025.01)

(58) Field of Classification Search
CPC .... H10D 30/6735; H10D 30/43; H10D 30/62; H10D 30/6757; H10D 84/0158; H10D 84/834; H10D 30/014; H10D 84/038; H01L 29/78696; H01L 29/775; H01L 29/66439; H01L 29/42392; H01L 29/7858; H01L 27/0886; H01L 21/823431
See application file for complete search history.

(56) References Cited

U.S. PATENT DOCUMENTS

| | | | |
|---|---|---|---|
| 5,600,587 A | 2/1997 | Koike | |
| 6,794,718 B2 * | 9/2004 | Nowak | H10D 84/0167 |
| | | | 438/149 |
| 2004/0119100 A1 | 6/2004 | Nowak et al. | |
| 2005/0199913 A1 | 9/2005 | Hofmann et al. | |
| 2006/0268597 A1 | 11/2006 | Sakuma | |

(Continued)

FOREIGN PATENT DOCUMENTS

| | | |
|---|---|---|
| WO | 2018111215 A1 | 6/2018 |
| WO | 2018125024 A1 | 7/2018 |

*Primary Examiner* — Earl N Taylor
(74) *Attorney, Agent, or Firm* — Akona IP PC

(57) ABSTRACT

An example IC device formed using trim patterning as described herein may include a support structure, a first elongated structure (e.g., a first fin or nanoribbon) and a second elongated structure (e.g., a second fin or nanoribbon), proximate to an end of the first elongated structure. An angle between a projection of the first elongated structure on the support structure and an edge of the support structure may be between about 5 and 45 degrees, while an angle between a projection of the second elongated structure on the support structure and the edge of the support structure may be less than about 15 degrees.

20 Claims, 24 Drawing Sheets

(56) References Cited

U.S. PATENT DOCUMENTS

| | | | |
|---|---|---|---|
| 2007/0187682 A1* | 8/2007 | Takeuchi | H10D 84/853 |
| | | | 257/E21.633 |
| 2008/0048226 A1 | 2/2008 | Heo et al. | |
| 2008/0121956 A1 | 5/2008 | Kanaya | |
| 2009/0121291 A1 | 5/2009 | Anderson et al. | |
| 2010/0187575 A1* | 7/2010 | Baumgartner | H03B 5/1228 |
| | | | 257/369 |
| 2010/0321975 A1 | 12/2010 | Kimura et al. | |
| 2012/0040528 A1 | 2/2012 | Kim et al. | |
| 2012/0314476 A1 | 12/2012 | Appenzeller et al. | |
| 2013/0153989 A1* | 6/2013 | Masuoka | H10D 84/038 |
| | | | 257/329 |
| 2014/0054681 A1* | 2/2014 | Masuoka | H10D 64/017 |
| | | | 257/329 |
| 2016/0027490 A1 | 1/2016 | Müller | |
| 2018/0182763 A1 | 6/2018 | Juengling | |
| 2019/0172832 A1* | 6/2019 | Chang | H10D 89/10 |
| 2020/0091162 A1 | 3/2020 | Morris et al. | |
| 2020/0203355 A1* | 6/2020 | Wu | H10D 84/834 |
| 2020/0220026 A1 | 7/2020 | Teo et al. | |
| 2021/0225849 A1 | 7/2021 | Kim | |
| 2021/0351132 A1 | 11/2021 | Liebmann et al. | |
| 2022/0246433 A1* | 8/2022 | Lin | H10D 84/038 |
| 2022/0302176 A1* | 9/2022 | Kang | H10D 64/258 |
| 2022/0376159 A1* | 11/2022 | Wang | H10N 10/01 |
| 2025/0159953 A1* | 5/2025 | Ghani | H01L 25/0655 |

* cited by examiner

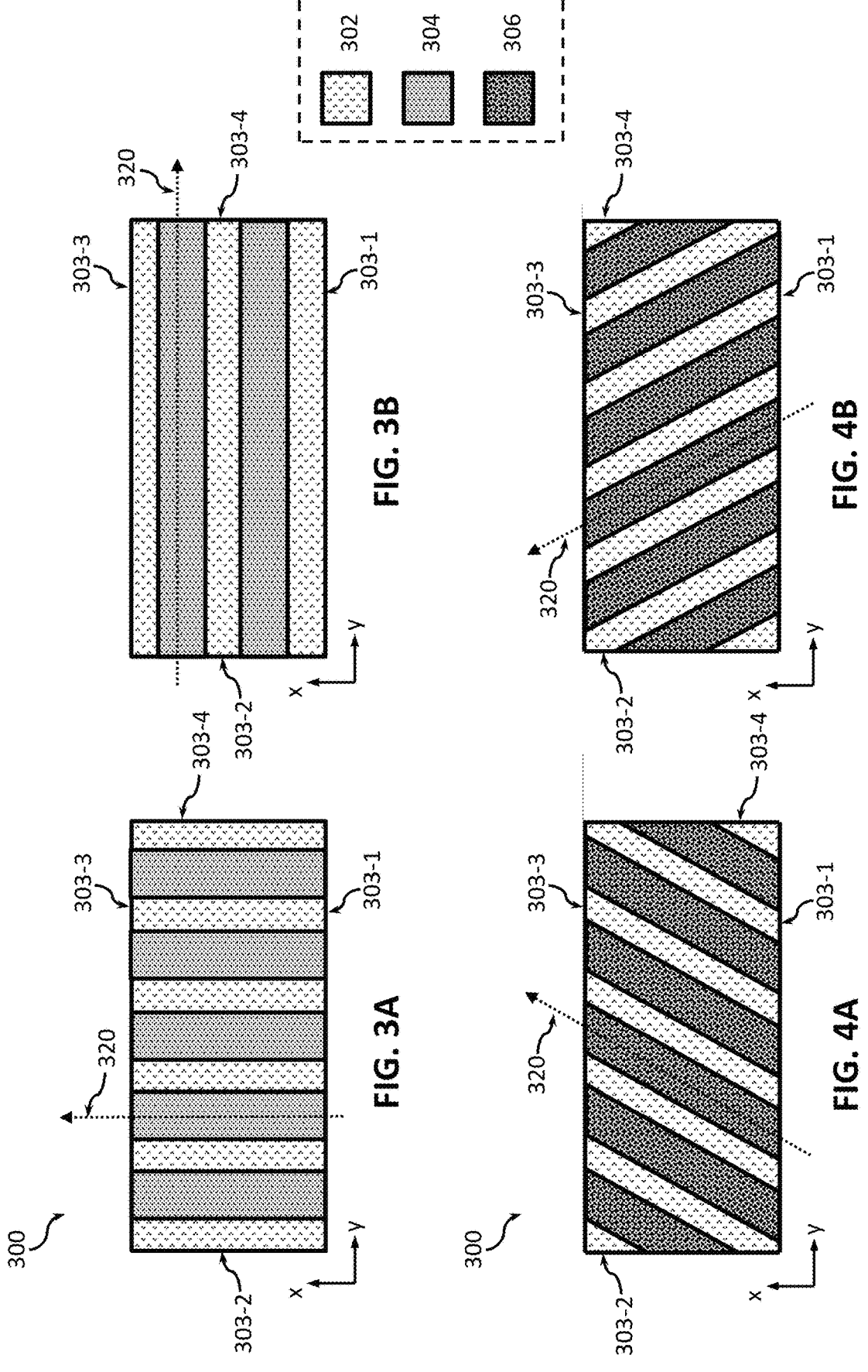

TRIM PATTERNING FOR FORMING ANGLED TRANSISTORS

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each contact becomes increasingly significant. Careful design of transistors may help with such an optimization.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3B provide top-down views of example IC devices with non-angled elongated semiconductor structures, in accordance with some embodiments.

FIGS. 4A-4B provide top-down views of example IC devices with angled elongated semiconductor structures, in accordance with some embodiments.

DETAILED DESCRIPTION

Figure 1:
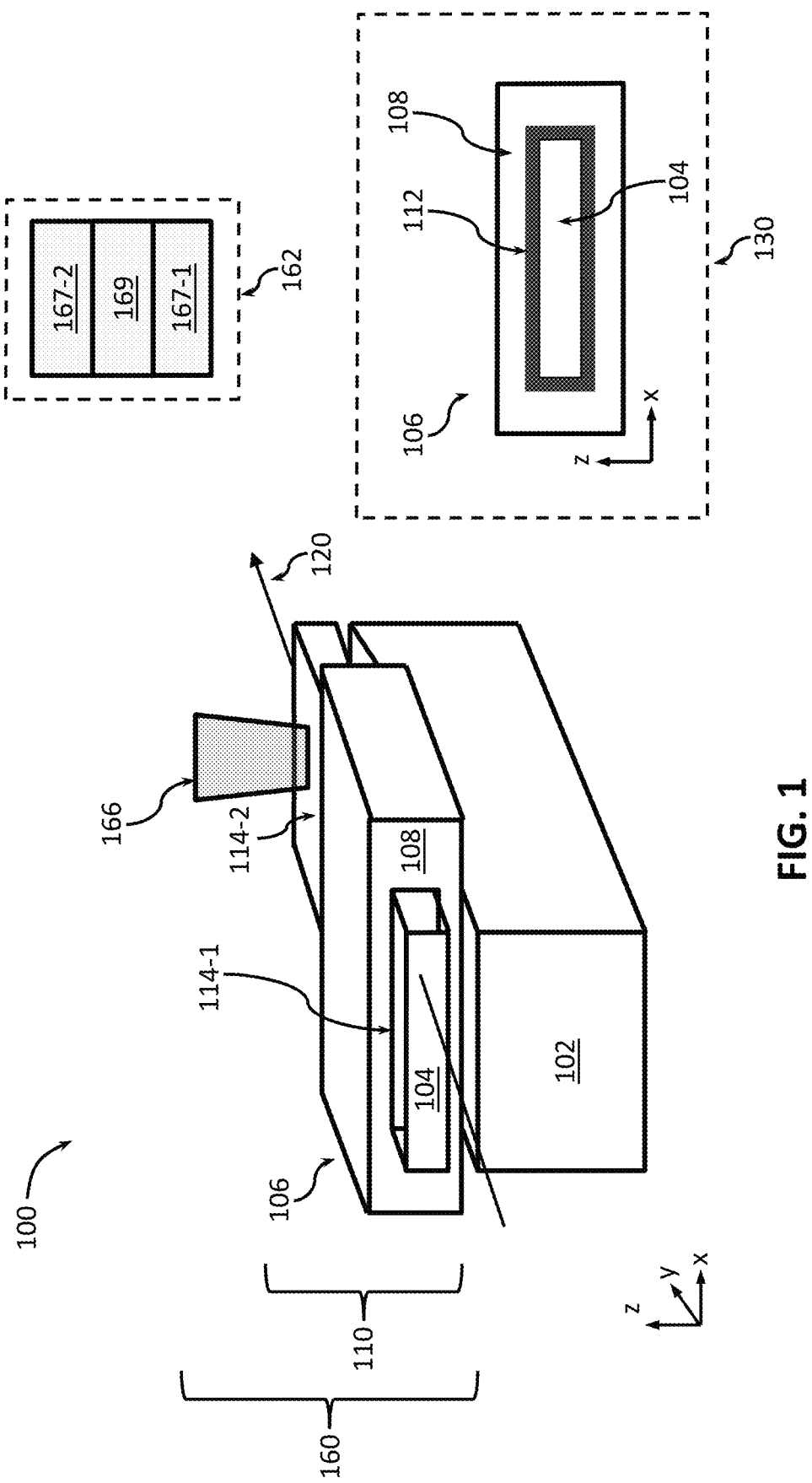
FIG. 1 provides a perspective view of an example IC device implementing a nanoribbon transistor, in accordance with some embodiments.

IC devices with angled transistors, and related assemblies and methods, are disclosed herein. The devices, assemblies, and methods of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating IC devices with angled transistors, proposed herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications.

A field-effect transistor (FET), e.g., a metal-oxide-semiconductor (MOS) FET (MOSFET), is a three-terminal device that includes source, drain, and gate terminals and uses electric field to control current flowing through the device. A FET typically includes a semiconductor channel material, a source region and a drain region provided in the channel material, and a gate stack that includes at least a gate electrode material and, optionally, may also include a gate insulator, where the gate stack is provided over a portion of the channel material between the source region and the drain region.

Recently, FETs with non-planar architectures, such as FinFETs (also sometimes referred to as "wrap around gate transistors" or "tri-gate transistors") and nanoribbon/nanowire transistors (also sometimes referred to as "gate all-around (GAA) transistors"), have been extensively explored as alternatives to transistors with planar architectures.

In a FinFET, an elongated semiconductor structure (i.e., an elongated structure that includes a semiconductor material) shaped as a fin extends away from a base (e.g., from a semiconductor substrate or any suitable support structure). A portion of a fin that is closest to the base may be enclosed by an insulator material. Such an insulator material, typically an oxide, is commonly referred to as a "shallow trench isolation" (STI), and the portion of the fin enclosed by the STI is referred to as a "subfin portion" or simply a "subfin." A gate stack may wrap around an upper portion of the fin (i.e., the portion farthest away from the base). The portion of the fin around which the gate stack wraps is referred to as a "channel" or a "channel portion" of a FinFET. A semiconductor material of the channel portion is commonly referred to as a "channel material" of the transistor. FinFETs are sometimes referred to as "tri-gate transistors" because, in use, such transistors may form conducting channels on three "sides" of the channel portion of the fin. A source region and a drain region are provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel portion" of a nanoribbon transistor is the portion of the nanoribbon around which the gate stack wraps. Such transistors are sometimes referred to as "GAA transistors" because, in use, such transistors may form conducting channels on all "sides" of the channel portion of the nanoribbon. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (i.e., a cross-section in a plane perpendicular to the longitudinal axis of the structure), while the term "nanowire" has been used to describe a similar structure but with a substantially circular or square transverse cross-sections. In the following, a single term "nanoribbon transistor" is used to describe all non-planar transistors where a gate stack wraps around substantially all sides of an elongated semiconductor structure, independent of the shape of the transverse cross-section. Thus, as used herein, the term "nanoribbon transistor" is used to cover transistors with elongated semiconductor structures that have substantially rectangular transverse cross-sections (possibly with rounded corners), transistors with elongated semiconductor structures that have substantially square transverse cross-sections (possibly with rounded corners), transistors with elongated semiconductor structures that have substantially circular or elliptical/oval transverse cross-sections, as well as transistors with elongated semiconductor structures that have any polygonal transverse cross-sections.

As the foregoing illustrates, both FinFETs and nanoribbon transistors are built based on elongated semiconductor structures. A longitudinal axis of such structures may be defined as a line that is the shortest line between a source region and a drain region of a FinFET or a nanoribbon transistor. Typically, such a line extends substantially parallel to a support structure (e.g., a die, a chip, a substrate, a carrier substrate, or a package substrate) on/in which a transistor resides and is one of lines of symmetry for the transistor (at least for the idealized version of the transistor that does not reflect unintended manufacturing variations that may affect the real-life geometry of the transistor). Conventionally, FinFETs and nanoribbon transistors are oriented on a support structure so that the longitudinal axes of their elongated semiconductor structures (i.e., fins or nanoribbons, respectively) are parallel to the front and back faces of the support structure and are either perpendicular or parallel to different edges of the support structure, in particular, being either perpendicular or parallel to different edges of the front face or the back face of the support structure. In contrast to such conventional implementations, embodiments of the present disclosure provide IC devices with angled transistors, where a transistor is referred to as "angled" if a longitudinal axis of the elongated semiconductor structure based on which the transistor is built is at an angle other than 0 degrees or 90 degrees with respect to edges of front or back faces of a support structure on/in which the transistor resides, e.g., at an angle between 10 degrees and 80 degrees with respect to at least one of the edges of front or back faces of the support structure (since not just one but two angles may be defined among any two lines crossing one another, the two angles adding together to be 180 degrees, for the angled structures/transistors, angles referred to herein refer to the smaller of the two angles for any given pair of two lines). Angled transistors provide a promising way to increasing densities of transistors, in particular, of FinFETs and nanoribbon transistors, on the limited real estate of semiconductor chips, and embodiments of the present disclosure provide solutions for layout and patterning of angled transistors, as well as for integration of angled and non-angled transistors.

An example IC device/structure formed using trim patterning as described herein may include a support structure (e.g., a die, a substrate, a carrier substrate, etc.); an elongated structure (e.g., a fin or a nanoribbon) of a semiconductor material provided over the support structure; a first further structure of the semiconductor material (i.e., the same material as the elongated structure), proximate to a first end of the elongated structure; and a second further structure of the semiconductor material (i.e., the same material as the elongated structure), proximate to a second end of the elongated structure (the second end being opposite the first end), where a projection of the elongated structure on the support structure is along a first longitudinal axis, a projection of the first further structure on the support structure is a curve, and a projection of the second further structure on the support structure is along a second longitudinal axis at an angle between 10 and 80 degrees to the first longitudinal axis. Another example IC device/structure formed using trim patterning as described herein may include a support structure; a first elongated structure of a semiconductor material (e.g., a first fin or nanoribbon) provided over the support structure; and a second elongated structure (e.g., a second fin or nanoribbon) of the semiconductor material (i.e., the same material as the first elongated structure), proximate to an end of the first elongated structure and at an angle between about 10 and 60 degrees with respect to the first elongated structure. An angle between a projection of the first elongated structure on the support structure and an edge of the support structure may be between about 5 and 45 degrees, while an angle between a projection of the second elongated structure on the support structure and the edge of the support structure may be less than about 15 degrees. Yet another example IC device/structure formed using trim patterning as described herein may include a support structure; a first fin provided over the support structure; and a second fin provided over the support structure, where an angle between a projection of the first fin on the support structure and an edge of the support structure is between about 5 and 45 degrees and an angle between a projection of the second fin on the support structure and the edge of the support structure is less than about 15 degrees.

In the following detailed description, various aspects of the illustrative implementations may be described using terms commonly employed by those skilled in the art to convey the substance of their work to others skilled in the art. For example, in context of source/drain (S/D) regions, the term "region" may be used interchangeably with the terms "contact" and "terminal" of a transistor. In another example, as used herein, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," "sulfide," etc. refer to compounds containing, respectively, oxygen, carbon, nitrogen, sulfur, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−10%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−10% of a target value, e.g., +/−5% of a target value or +/−2% of a target value, based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, analogous elements designated in the present drawings with different reference numerals after a dash, e.g., edges 303-1, 303-2, 303-3, and 303-4 may be collectively referred to together without the reference numerals after the dash, e.g., as "edges 303." In order to not clutter the drawings, if multiple instances of certain elements are illustrated, only some of the elements may be labeled with a reference sign. A plurality of drawings with the same number and different letters may be referred to without the letters, e.g., FIGS. 5A-5Q may be referred to as "FIG. 5."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of IC devices with angled transistors as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with angled transistors as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 provides a perspective view of an example IC device 100 implementing a nanoribbon transistor 110, in accordance with some embodiments. The nanoribbon transistor 110 is one example of an angled transistor that may be included in various IC devices and assemblies described herein.

Turning to the details of FIG. 1, the IC device 100 may include a semiconductor material, which may include one or more semiconductor materials, formed as a nanoribbon 104 (i.e., an elongated semiconductor structure) extending substantially parallel to a support structure 102. The transistor 110 may be formed on the basis of the nanoribbon 104 by having a gate stack 106 at least partially wrap around a portion of the nanoribbon referred to as a "channel portion" and by having source and drain regions, shown in FIG. 1 as a first S/D region 114-1 and a second S/D region 114-2, on either side of the gate stack 106. In some embodiments, a layer of oxide material (not specifically shown in FIG. 1) may be provided between the support structure 102 and the gate stack 106.

The IC device 100 shown in FIG. 1, as well as IC devices shown in other drawings of the present disclosure, is intended to show relative arrangements of some of the components therein, and the IC device 100, or portions thereof, may include other components that are not illustrated (e.g., electrical contacts to the S/D regions 114 of the transistor 110, additional layers such as a spacer layer around the gate stack 106 of the transistor 110, etc.). For example, although not specifically illustrated in FIG. 1, a dielectric spacer may be provided between a first S/D contact that may be coupled to a first S/D region 114-1 of the transistor 110 and the gate stack 106 as well as between a second S/D contact that may be coupled to a second S/D region 114-2 of the transistor 110 and the gate stack 106 in order to provide electrical isolation between the source, gate, and drain contacts (in general, "contacts" described herein may also be referred to as "electrodes"). In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Implementations of the present disclosure may be formed or carried out on any suitable support structure 102, such as a substrate, a die, a wafer, or a chip. The support structure 102 may, e.g., be the wafer 2000 of FIG. 8, discussed below, and may be, or be included in, a die, e.g., the singulated die 2002 of FIG. 8, discussed below. The support structure 102 may be a semiconductor substrate composed of semiconductor material systems including, for example, N-type or P-type materials systems. In one implementation, the semiconductor substrate may be a crystalline substrate formed using a bulk silicon or a SOI substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which an IC device with angled transistors as described herein may be built falls within the spirit and scope of the present disclosure.

The nanoribbon 104 may take the form of a nanowire or nanoribbon, for example. In some embodiments, an area of a transverse cross-section of the nanoribbon 104 (i.e., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). The transverse cross-section of the nanoribbon 104 is cross-section along a plane perpendicular to a longitudinal axis 120 of the nanoribbon 104, where the longitudinal axis 120 may, e.g., be along the y-axis of the example coordinate system shown in FIG. 1. In some embodiments, a width of the nanoribbon 104 (i.e., a dimension measured in a plane parallel to the support structure 102 and in a direction perpendicular to the longitudinal axis 120, e.g., along the x-axis of the example coordinate system shown FIG. 1) may be at least about 3 times larger than a thickness (or a "height") of the nanoribbon 104 (i.e., a dimension measured in a plane perpendicular to the support structure 102, e.g., along the z-axis of the example coordinate system shown in FIG. 1), including all values and ranges therein, e.g., at least about 4 times larger, or at least about 5 times larger. It should be noted that FIG. 1 illustrates the x-y-z coordinate system being aligned so that the longitudinal axis 120 is along the y-axis only for the ease of explanations of this particular drawing. In other drawings, angled transistors are explained with reference to their longitudinal axes being somewhere in the x-y plane but not aligned with either y-axis or x-axis because the edges of the support structure are assumed to be aligned with those axes and the transistors are angled, meaning that they are at an angle between 10 degrees and 80 degrees with respect to y-axis and/or x-axis. Thus, when the transistor 110 is an angled transistor of any of the subsequent drawings, the longitudinal axis 120 is not aligned with the y-axis as shown in FIG. 1 but at an angle between 10 degrees and 80 degrees with respect to y-axis.

Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. The terms "front face" and "back face" of a nanoribbon may refer to the faces of the nanoribbon 104 that are substantially parallel to the support structure 102, the term "sidewall" (or "side face") of a nanoribbon may refer to the opposing faces of the nanoribbon 104 that are substantially perpendicular to the support structure 102 and extend in a direction of the longitudinal axis 120 of the nanoribbon 104, while the term "end" of a nanoribbon may refer to the opposing faces of the nanoribbon 104 that are substantially perpendicular to the longitudinal axis 120 of the nanoribbon 104.

The nanoribbon 104 may be formed of one or more semiconductor materials, together referred to as a "channel material." In general, channel materials of any of the angled transistors described herein, e.g., the channel material of the transistor 110, may be composed of semiconductor material systems including, for example, N-type or P-type materials systems. In some embodiments, the channel material may include a substantially monocrystalline semiconductor, such as silicon (Si) or germanium (Ge). In some embodiments, the channel material may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a combination of semiconductor materials.

For some example N-type transistor embodiments (i.e., for the embodiments where the transistor in which the channel material is included is an N-type metal-oxide-semiconductor (NMOS) transistor), the channel material may include a III-V material having a relatively high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). For some example P-type transistor embodiments (i.e., for the embodiments where the transistor in which the channel material is included is a P-type metal-oxide-semiconductor (PMOS) transistor), the channel material may advantageously be a group IV material having a high hole mobility, such as, but not limited to Ge or a Ge-rich SiGe alloy. For some example embodiments, the channel material may have a Ge content between 0.6 and 0.9, and advantageously may be at least 0.7.

In some embodiments, the channel material may be a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors. IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

In some embodiments, any of the angled transistors described herein, e.g., the transistor 110, may be a thin-film transistor (TFT). A TFT is a special kind of a FET made by depositing active semiconductor material over a support (e.g., a support structure as described above) that may be a non-conducting support. Some such materials may be deposited at relatively low temperatures, which allows depositing them within the thermal budgets imposed on back-end fabrication to avoid damaging the front-end components such as the logic devices of an IC device in which the transistor may be included. Thus, in some embodiments, the channel material of any of the angled transistors described herein, e.g., the transistor 110, may be a semiconductor material deposited at relatively low temperatures, and may include any of the oxide semiconductor materials described above.

In other embodiments, instead of being deposited at relatively low temperatures as described above with reference to the TFTs, the channel material of any of the angled transistors described herein, e.g., the transistor 110, may be epitaxially grown in what typically involves relatively high-temperature processing. In such embodiments, the channel material may include any of the semiconductor materials described above, including oxide semiconductor materials. In some such embodiments, the channel material may be epitaxially grown directly on a semiconductor layer of a support structure over which the transistor will be fabricated, in a process known as "monolithic integration." In other such embodiments, the channel material of any of the angled transistors described herein, e.g., the transistor 110, may be epitaxially grown on a semiconductor layer of another support structure and then the epitaxially grown layer of the channel material may be transferred, in a process known as a "layer transfer," to a support structure over which the transistor will reside, in which case the latter support structure may but does not have to include a semiconductor layer prior to the layer transfer. Layer transfer advantageously allows forming non-planar transistors, such as FinFETs or nanoribbon transistors, over support structures or in layers that do not include semiconductor materials (e.g., in the back end of an IC device). Layer transfer also advantageously allows forming transistors of any architecture (e.g., non-planar or planar transistors) without imposing the negative effects of the relatively high-temperature epitaxial growth process on devices that may already be present over a support structure.

A channel material that is deposited at relatively low temperatures is typically a polycrystalline, polymorphous, or amorphous semiconductor, or any combination thereof. A channel material that is epitaxially grown is typically a highly crystalline (e.g., monocrystalline or single-crystalline) material. Therefore, whether the channel material of any of the angled transistors described herein, e.g., the transistor 110, is deposited at relatively low temperatures or epitaxially grown can be identified by inspecting grain size of the active portions of the channel material (e.g., of the portions of the channel material that form channels of transistors). An average grain size of a channel material of any of the angled transistors described herein, e.g., the transistor 110, being between about 0.5 and 1 millimeters (in which case the material may be polycrystalline) or smaller than about 0.5 millimeter (in which case the material may be polymorphous or amorphous) may be indicative of the channel material having been deposited (e.g., in which case the transistors in which such a channel material is included are TFTs). On the other hand, an average grain size of a channel material of any of the angled transistors described herein, e.g., the transistor 110, being equal to or greater than about 1 millimeter (in which case the material may be a single-crystal material) may be indicative of the channel material having been epitaxially grown and included in the final device either by monolithic integration or by layer transfer.

In some embodiments, the channel material of any of the angled transistors described herein, e.g., the transistor 110, may include a two-dimensional (2D) semiconductor material, i.e., a semiconductor material with a thickness of a few nanometers or less, where electrons in the material are free to move in the 2D plane but their restricted motion in the third direction is governed by quantum mechanics. In some such embodiments, such a channel material may include a single atomic monolayer of a 2D semiconductor material, while, in other such embodiments, such a channel material may include five or more atomic monolayers of a 2D semiconductor material. Examples of 2D materials that may be used to implement the channel material of any of the angled transistors described herein include, but are not limited to, graphene, hexagonal boron nitride, or transition-metal chalcogenides.

A gate stack 106 including a gate electrode material 108 and, optionally, a gate insulator 112, may wrap entirely or almost entirely around a portion of the nanoribbon 104 as shown in FIG. 1, with the channel portion of the transistor 110 being the active region (channel region) of the channel material in the portion of the nanoribbon 104 wrapped by the gate stack 106. The gate insulator 112 is not shown in the perspective drawing of the IC device 100 shown in FIG. 1 but is shown in an inset 130 of FIG. 1, providing a cross-sectional side view of a portion of the nanoribbon 104 with a gate stack 106 wrapping around it. As shown in FIG. 1, the gate insulator 112 may wrap around a transversal portion/cross-section of the nanoribbon 104, and the gate electrode material 108 may wrap around the gate insulator 112.

The gate electrode material 108 may include at least one P-type work function metal or N-type work function metal, depending on whether the transistor 110 is a PMOS transistor or an NMOS transistor. P-type work function metal may be used as the gate electrode material 108 when the transistor 110 is a PMOS transistor and N-type work function metal may be used as the gate electrode material 108 when the transistor 110 is an NMOS transistor. For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate insulator 112 may include one or more high-k dielectrics including any of the materials discussed herein with reference to the insulator material that may surround portions of the transistor 110. In some embodiments, an annealing process may be carried out on the gate insulator 112 during manufacture of the transistor 110 to improve the quality of the gate insulator 112. The gate insulator 112 may have a thickness that may, in some embodiments, be between about 0.5 nanometers and 3 nanometers, including all values and ranges therein (e.g., between about 1 and 3 nanometers, or between about 1 and 2 nanometers), although, in other embodiments, the thickness of the gate insulator 112 may be greater than 3 nanometers. In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, the gate insulator 112 may include a hysteretic material or a hysteretic arrangement, which, together, may be referred to as a "hysteretic element." Transistors 110 in which the gate insulator 124 includes a hysteretic element may be described as "hysteretic transistors" and may be used to implement hysteretic memory. Hysteretic memory refers to a memory technology employing hysteretic materials or arrangements, where a material or an arrangement may be described as hysteretic if it exhibits the dependence of its state on the history of the material (e.g., on a previous state of the material). Ferroelectric (FE) and antiferroelectric (AFE) materials are examples of hysteretic materials. Layers of different materials arranged in a stack to exhibit charge-trapping phenomena is an example of a hysteretic arrangement.

A FE or an AFE material is a material that exhibits, over some range of temperatures, spontaneous electric polarization, i.e., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (i.e., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. Because the current state of the electric dipoles in FE and AFE materials depends on the previous state, such materials are hysteretic materials. Memory technology where logic states are stored in terms of the orientation of electric dipoles in (i.e., in terms of polarization of) FE or AFE materials is referred to as "FE memory," where the term "ferroelectric" is said to be adopted to convey the similarity of FE memories to ferromagnetic memories, even though there is typically no iron (Fe) present in FE or AFE materials.

A stack of alternating layers of materials that is configured to exhibit charge-trapping is an example of a hysteretic arrangement. Such a stack may include as little as two layers of materials, one of which is a charge-trapping layer (i.e., a layer of a material configured to trap charges when a voltage is applied across the material) and the other one of which is a tunnelling layer (i.e., a layer of a material through which the charge is to be tunneled to the charge-trapping layer). The tunnelling layer may include an insulator material such as a material that includes silicon and oxygen (e.g., silicon oxide), or any other suitable insulator. The charge-trapping layer may include a metal or a semiconductor material that is configured to trap charges. Because the trapped charges may be kept in a charge-trapping arrangement for some time even in the absence of an electric field, such arrangements may be used to implement memory cells. Because the presence and/or the number of trapped charges in a charge-trapping arrangement depends on the previous state, such arrangements are hysteretic arrangements. Memory technology where logic states are stored in terms of the amount of charge trapped in a hysteretic arrangement may be referred to as "charge-trapping memory."

Hysteretic memories have the potential for adequate non-volatility, short programming time, low power consumption, high endurance, and high-speed writing. In addition, hysteretic memories may be manufactured using processes compatible with the standard complementary metal-oxide-semiconductor (CMOS) technology. Therefore, over the last few years, these types of memories have emerged as promising candidates for many growing applications.

In some embodiments, the hysteretic element of the gate insulator 112 may be provided as a layer of a FE or an AFE material. Such an FE/AFE material may include one or more materials that can exhibit sufficient FE/AFE behavior even at thin dimensions, e.g., such as an insulator material at least about 5%, e.g., at least about 7% or at least about 10%, of which is in an orthorhombic phase and/or a tetragonal phase (e.g., as a material in which at most about 95-90% of the material may be amorphous or in a monoclinic phase). For example, such materials may be based on hafnium and oxygen (e.g., hafnium oxides), with various dopants added to ensure sufficient amount of an orthorhombic phase or a tetragonal phase. Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used as the hysteretic element and are within the scope of the present disclosure.

In other embodiments, the hysteretic element of the gate insulator 112 may be provided as a stack of alternating layers of materials that can trap charges. In some such embodiments, the stack may be a two-layer stack, where one layer is a charge-trapping layer and the other layer is a tunnelling layer. The tunnelling layer may include an insulator material such as a material that includes silicon and oxygen (e.g., silicon oxide), or any other suitable insulator. The charge-trapping layer may include an electrically conductive material such as a metal, or a semiconductor material. In some embodiments, the charge-trapping layer may include a sub-stoichiometric material (i.e., a material that includes less than a stochiometric amount of a reagent). The sub-stoichiometric material may include vacancies in concentration of at least about $10^{18}$ vacancies per cubic centimeter, e.g., in concentration between about $10^{18}$ vacancies per cubic centimeter and about $10^{22}$-$10^{23}$ vacancies per cubic centimeter. As known in the art, vacancies refer to cites where atoms (e.g., oxygen or nitrogen) that should be present are missing, thus providing a defect in a material. For example, the sub-stoichiometric material of any of the hysteretic elements described herein may include oxygen and the vacancies may be oxygen vacancies, or the sub-stoichiometric material may include nitrogen and the vacancies may be nitrogen vacancies. During operation, charges may be trapped in the vacancies of the sub-stoichiometric material. Thus, implementing a sub-stoichiometric material with vacancies is one way to provide a charge-trapping layer of a hysteretic arrangement. In general, any material that has defects that can trap charge may be used in/as a charge-trapping layer. Such defects are very detrimental to operation of logic devices and, therefore, typically, deliberate steps need to be taken to avoid presence of the defects. However, for memory devices, such defects are desirable because charge-trapping may be used to represent different memory states of a memory cell.

In some embodiments of the hysteretic element being provided as a stack of alternating layers of materials that can trap charges, the stack may be a three-layer stack where an insulator material is provided on both sides of a charge-trapping layer. In such embodiments, a layer of an insulator material on one side of the charge-trapping layer may be referred to as a "tunnelling layer" while a layer of an insulator material on the other side of the charge-trapping layer may be referred to as a "field layer."

In various embodiments of the hysteretic element being provided as a stack of alternating layers of materials that can trap charges, a thickness of each layer the stack may be between about 0.5 and 10 nanometers, including all values and ranges therein, e.g., between about 0.5 and 5 nanometers. In some embodiment of a three-layer stack, a thickness of each layer of the insulator material may be about 0.5 nanometers, while a thickness of the charge-trapping layer may be between about 1 and 8 nanometers, e.g., between about 2.5 and 7.5 nanometers, e.g., about 5 nanometers. In some embodiments, a total thickness of the hysteretic element provided as a stack of alternating layers of materials that can trap charges (i.e., a hysteretic arrangement) may be between about 1 and 10 nanometers, e.g., between about 2 and 8 nanometers, e.g., about 6 nanometers.

Turning to the S/D regions 114 of the transistor 110, in some embodiments, the S/D regions may be highly doped, e.g., with dopant concentrations of about $10^{21}$ dopants per cubic centimeter, in order to advantageously form Ohmic contacts with the respective S/D electrodes, although these regions may also have lower dopant concentrations and may form Schottky contacts in some implementations. Irrespective of the exact doping levels, the S/D regions of a transistor may be the regions having dopant concentration higher than in other regions, e.g., higher than a dopant concentration in the channel portion (i.e., in a channel material extending between the first S/D region 114-1 and the second S/D region 114-2), and, therefore, may be referred to as "highly doped" (HD) regions. The channel portion of the transistor 110 may include semiconductor materials with doping concentrations significantly smaller than those of the S/D regions 114.

The S/D regions 114 of the transistor 110 may generally be formed using either an implantation/diffusion process or an etching/deposition process. In the former process, dopants such as boron, aluminum, antimony, phosphorous, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (i.e., a dimension measured along the longitudinal axis 120 of the nanoribbon 104) may be between about 5 and 40 nanometers, including all values and ranges therein (e.g., between about 22 and 35 nanometers, or between about 20 and 30 nanometers).

In some embodiments, angled transistors described herein may be implemented in memory arrays. In some such embodiments, an angled transistor may be coupled to a storage element, thus forming a 1T-1X memory cell of a memory array, where "1T" in the term "1T-1X memory cell" indicates that the memory cell includes one transistor (T), and where "lx" in the term "1T-1X memory cell" indicates that the memory cell includes one storage element (X). In other embodiments, an angled transistor may be coupled to multiple storage elements, or an angled transistor may be coupled to another transistor, to form one or more memory cells of a memory array, all of which being within the scope of the present disclosure. Generally, a storage element may be any suitable IC component that can be programmed to a target data state (e.g., corresponding to a particular charged stored on the storage element or corresponding to a particular resistance state of the storage element) by applying an electric field or energy (e.g., positive or negative voltage or current pulses) to the storage element for a particular duration. In various embodiments, a storage element may be a capacitor, a resistive storage element, a resistive random-access memory (RRAM) device, a metal filament memory device, a phase change memory (PCM) device, a magnetic random-access memory (MRAM) device, etc.

An example of using the transistor 110 as a part of a memory cell is illustrated in FIG. 1, showing that the IC device 100 may include a memory cell 160 that includes the transistor 110 and a storage element 166, electrically coupled to the S/D region 114-2. In various embodiments, the storage element 166 may include one of a capacitor, a magnetoresistive material, a ferroelectric material, or a resistance-changing material. In some embodiments, the storage element 166 may include two electrodes 167-1 and 167-2, separated by a memory material 169. One example of the electrodes 167 and the memory material 169 of the storage element 166 is schematically illustrated within the dashed contour of an inset 162 of FIG. 1, although, in other embodiments, the spatial arrangement of the memory material 169 and the electrodes 167 may be different as long as the memory material 169 is spatially between the electrode 167-1 and the electrode 167-2 (e.g., the memory material 169 does not have to be a planar layer but may be arranged in any kind of a three-dimensional arrangement). The memory material 169 may be any suitable material that can put into a target state by applying an electric field or energy (e.g., positive or negative voltage or current pulses) to one or both electrodes 167 of the storage element 166 for a particular duration, thus programming the storage element 166 to a target data state (e.g., corresponding to a particular charged stored on the storage element 166 or corresponding to a particular resistance state of the storage element 166). Such a storage element 166 may be electrically coupled to the S/D region 114-2 by coupling the electrode 167-1 of the storage element 166 to the S/D region 114-2 (e.g., in some embodiments, the electrode 167-1 of the storage element 166 and a contact to the S/D region 114-2 may be a shared contact of a suitable electrically conductive material).

As an example, a dynamic random-access memory (DRAM) cell may include a storage element 166 in a form of a capacitor for storing a bit value, or a memory state (e.g., logical "1" or "0") of the cell, and an access transistor, implemented as the transistor 110, controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). In such embodiments, the electrodes 167 may be capacitor electrodes, and the memory material 169 may be a capacitor insulator. In some embodiments, the memory material 169 of such a capacitor may be a dielectric material. In other embodiments, the memory material 169 of such a capacitor may be a hysteretic element, e.g., as described above with reference to the embodiments where the gate insulator 112 is a hysteretic element.

In another example, the storage element 166 may be a resistive storage element (also referred to herein as a "resistive switch") that includes the memory material 169 that is a resistance-changing material, i.e., during operation the memory material 169 can be switched between two different nonvolatile states: a high resistance state (HRS) and a low resistance state (LRS). The state of a resistive storage element may be used to represent a data bit (e.g., logical "1" for HRS and logical "0" for LRS, or vice versa). A resistive storage element may have a voltage threshold beyond which the resistive storage element is in the LRS; driving a resistive storage element into the LRS may be referred to as SET (with an associated SET threshold voltage). Similarly, a resistive storage element may have a voltage threshold beyond which the resistive storage element is in the HRS; driving a resistive storage element into the HRS may be referred to as RESET (with an associated RESET threshold voltage).

In another example, the storage element 166 may be a RRAM device; in such embodiments, the memory material 169 may include an oxygen exchange layer (e.g., hafnium) and an oxide layer, as known in the art.

In yet another example, the storage element 166 may be a metal filament memory device (e.g., a conductive bridging random-access memory (CBRAM) device); in such embodiments, the memory material 169 may include a solid electrolyte, and one of the electrodes 167 of the storage element 166 may be an electrochemically active material (e.g., silver or copper), and the other of the electrodes 167 of the storage element 166 may be an inert material (e.g., an inert metal), as known in the art. A chemical barrier layer (e.g., tantalum, tantalum nitride, or tungsten) may be disposed between the electrochemically active electrode and the solid electrolyte to mitigate diffusion of the electrochemically active material into the solid electrolyte, in some such embodiments.

In some embodiments, the storage element 166 may be a PCM device; in such embodiments, the memory material 169 may include a chalcogenide or other phase change memory material.

In some embodiments, the storage element 166 may be a MRAM device; in such embodiments, the memory material 169 may include a thin tunnel barrier material, and the electrodes 167 of the storage element 166 may be magnetic (e.g., ferromagnetic). As known in the art, MRAM devices may operate on the principle of tunnel magnetoresistance between two magnetic layers (e.g., the electrodes of the storage element 166) separated by a tunnel junction (e.g., the memory material of the storage element 166). An MRAM device may have two stable states: when the magnetic moments of the two magnetic layers are aligned parallel to each other, an MRAM device may be in the LRS, and when aligned antiparallel, an MRAM device may be in the HRS.

Figure 2:
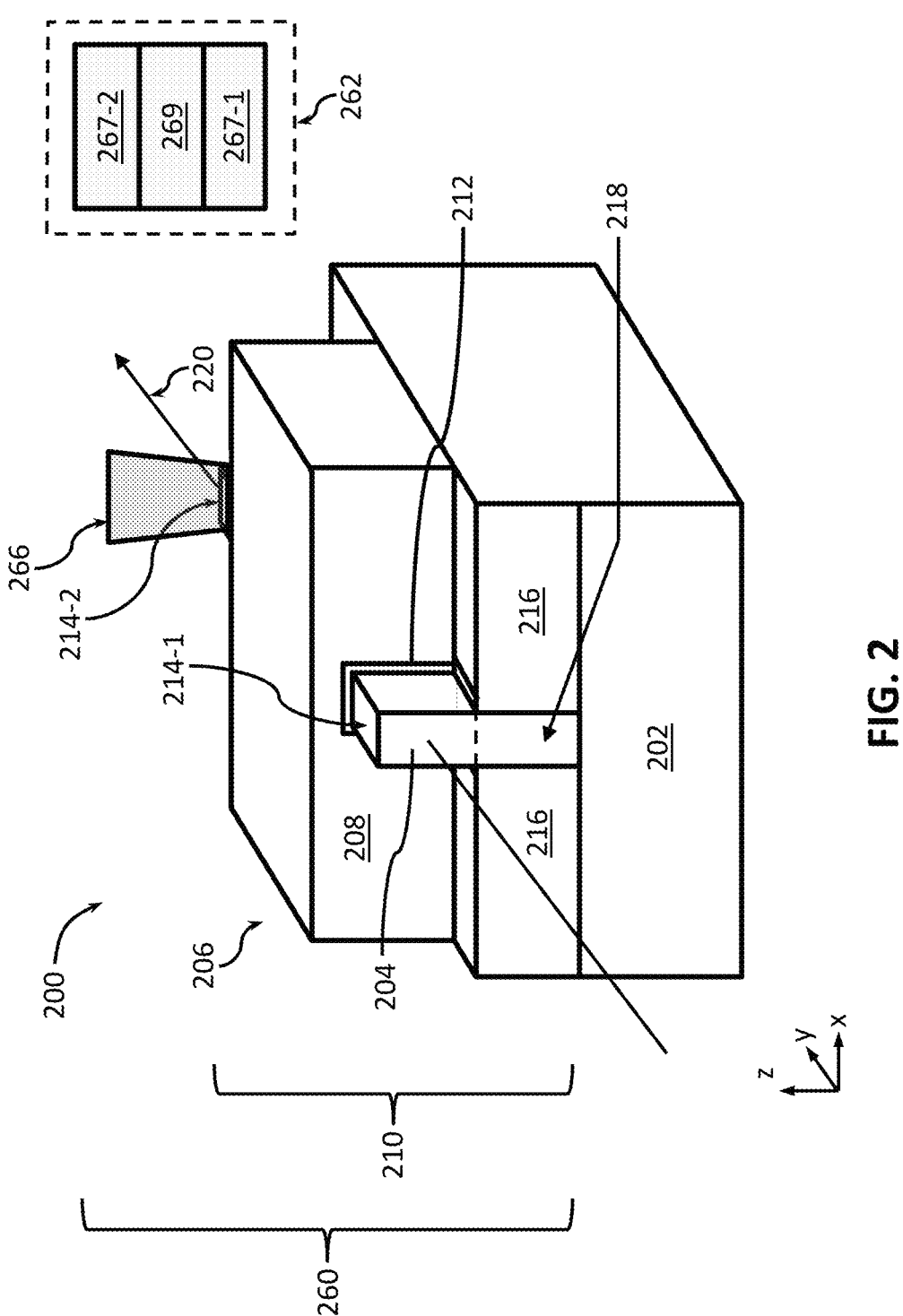
FIG. 2 provides a perspective view of an example IC device implementing a fin-based field-effect transistor (Fin-FET), in accordance with some embodiments.

FIG. 2 provides a perspective view of an example IC device 200 implementing a FinFET 210, in accordance with some embodiments. The FinFET 210 is another example of an angled transistor that may be included in various IC devices and assemblies described herein.

The IC device 200 shown in FIG. 2 is intended to show relative arrangements of some of the components therein, and the IC device 200, or portions thereof, may include other components that are not illustrated. For example, although not specifically illustrated in FIG. 2, a dielectric spacer may be provided between a first S/D contact that may be coupled to a first S/D region 214-1 of the transistor 210 and the gate stack 206 as well as between a second S/D contact that may be coupled to a second S/D region 214-2 of the transistor 210 and the gate stack 206 in order to provide electrical isolation between the source, gate, and drain contacts. In another example, although not specifically illustrated in FIG. 2, at least portions of the transistor 210 may be surrounded in an insulator material, such as any suitable ILD material.

Turning to the details of FIG. 2, the IC device 200 may include a semiconductor material, which may include one or more semiconductor materials, formed as a fin 204 extending away from a support structure 202. A FinFET 210 may be formed on the basis of the fin 204 by having a gate stack 206 at least partially wrap around a channel portion of the fin 204 and by having source and drain regions, shown in FIG. 2 as a first S/D region 214-1 and a second S/D region 214-2, on either side of the gate stack 206. As shown in FIG. 2, the gate stack 206 includes a gate electrode material 208 and a gate insulator 212, each of which wraps entirely or almost entirely around the channel portion of the fin 204, although in other embodiments of the IC device 200 the gate insulator 212 may be absent. Descriptions provided above with reference to the support structure 102, the gate stack 106, the gate electrode material 108, the gate insulator 112, and the S/D regions 114 are applicable to, respectively, the support structure 202, the gate stack 206, the gate electrode material 208, the gate insulator 212, and the S/D regions 214, and, therefore, in the interests of brevity, are not repeated. FIG. 2 further illustrates an STI 216, enclosing sidewalls of a subfin portion 218 of the fin 204. The STI 216 may include any of the insulator materials described above, e.g., any suitable ILD materials. Descriptions provided above with reference to the channel material of the transistor 110 are applicable to the semiconductor material of at least a channel portion of the fin 204 (e.g., of at least a portion of the fin 204 wrapped by the gate stack 206) and, therefore, in the interests of brevity, are not repeated.

A longitudinal axis 220 of the fin 204 may be along the y-axis of the example coordinate system shown in the present drawings. The FinFET 210 may have a gate length (i.e., a distance between the first and second S/D regions 214-1, 214-2), a dimension measured along the longitudinal axis 220, which may, in some embodiments, be between 2 and 60 nanometers, including all values and ranges therein (e.g., between 5 and 20 nanometers, or between 5 and 30 nanometers). Although the fin 204 is illustrated in FIG. 2 as having a rectangular cross-section in an x-z plane, the fin 204 may instead have a cross-section that is rounded or sloped at the "top" of the fin 204, and the gate stack 206 may conform to this rounded or sloped fin 204. In use, the FinFET 210 may form conducting channels on three "sides" of the fin 204, potentially improving performance relative to single-gate transistors (which may form conducting channels on one "side" of a channel material or substrate) and double-gate transistors (which may form conducting channels on two "sides" of a channel material or substrate). It should be noted that, similar to FIG. 1, FIG. 2 illustrates the x-y-z coordinate system being aligned so that the longitudinal axis 220 is along the y-axis only for the ease of explanations of this particular drawing. In other drawings, angled transistors are explained with reference to their longitudinal axes being somewhere in the x-y plane but not aligned with either y-axis or x-axis because the edges of the support structure are assumed to be aligned with those axes and the transistors are angled, meaning that they are at an angle between 10 degrees and 80 degrees with respect to y-axis and/or x-axis. Thus, when the FinFET 210 is an angled transistor of any of the subsequent drawings, the longitudinal axis 220 is not aligned with the y-axis as shown in FIG. 2 but at an angle between 10 degrees and 80 degrees with respect to y-axis.

An example of using the FinFET 210 as a part of a memory cell is illustrated in FIG. 2, showing that the IC device 200 may include a memory cell 260 that includes the FinFET 210 and a storage element 266, electrically coupled to the S/D region 214-2. In some embodiments, the storage element 266 may include two electrodes 267-1 and 267-2, separated by a memory material 269. One example of the electrodes 267 and the memory material 269 of the storage element 266 is schematically illustrated within the dashed contour of an inset 262 of FIG. 2, although, in other embodiments, the spatial arrangement of the memory material 269 and the electrodes 267 may be different as long as the memory material 269 is spatially between the electrode 267-1 and the electrode 267-2 (e.g., the memory material 269 does not have to be a planar layer but may be arranged in any kind of a three-dimensional arrangement). Descriptions provided above with reference to the storage element 166, the electrodes 167, and the memory material 169 are applicable to, respectively, the storage element 266, the electrodes 267, and the memory material 269, and, therefore, in the interests of brevity, are not repeated.

Either the nanoribbon 104 or the fin 204 may be an elongated semiconductor structure based on which any of the angled transistors described herein may be built (i.e., any of the angled transistors may be implemented as, e.g., the transistor 110 or the FinFET 210). Differences between non-angled elongated semiconductor structures and angled elongated semiconductor structures are described with reference to FIGS. 3A-3B and FIGS. 4A-4B. In particular, FIGS. 3A-3B illustrate example IC devices 300 with non-angled elongated semiconductor structures 304, in accordance with some embodiments, while FIGS. 4A-4B illustrate example IC devices 300 with angled elongated semiconductor structures 306. A number of elements labeled in FIGS. 3A-3B and FIGS. 4A-4B, as well in some of the subsequent drawings (e.g., FIGS. 6A-6H) with reference numerals are indicated in these drawings with different patterns in order to not clutter the drawings with too many reference numerals, with a legend showing the correspondence between the reference numerals and patterns being provided to the right of FIGS. 3A-3B and FIGS. 4A-4B. For example, the legend illustrates that FIGS. 3A-3B and FIGS. 4A-4B use different patterns to show a support structure 302, non-angled elongated semiconductor structures 304, and angled elongated semiconductor structures 306.

The IC devices 300 shown in FIGS. 3A-3B and FIGS. 4A-4B are intended to show relative arrangements of some of the components therein, and the IC devices 300, or portions thereof, may include other components that are not illustrated. For example, although not specifically illustrated in FIGS. 3A-3B and FIGS. 4A-4B, the IC devices 300 may include transistors implemented in, or based on, the elongated semiconductor structures 304, 306, which transistors would include gate stacks, S/D regions, and other portions, e.g., as described above with reference to FIGS. 1 and 2. In another example, although not specifically illustrated in FIGS. 3A-3B and FIGS. 4A-4B, at least portions of the elongated semiconductor structures 304, 306 may be surrounded in an insulator material, such as any suitable ILD material.

As shown in FIGS. 3A-3B and FIGS. 4A-4B, the IC device 300 may include a support structure 302, which may include four edges 303, individually shown as an edge 303-1, 303-2, 303-3, and 303-4. The edges 303 may be edges of either the front face of the support structure 302 or the back face of the support structure 302, depending on whether the non-angled elongated semiconductor structures 304 and the angled elongated semiconductor structures 306 are provided on the front face or the back face of the support structure 302. The support structure 302 may be any of the support structures 102/202, described herein. The support structure 302 is rectangular and, therefore, adjacent ones of the edges 303 are at 90 degrees with respect to one another (e.g., the edges 303-1 and 303-2 are adjacent and at 90 degrees with respect to one another, the edges 303-2 and 303-3 are adjacent and at 90 degrees with respect to one another, and so on).

As shown in FIGS. 3A-3B, a plurality of parallel non-angled elongated semiconductor structures 304 may be provided over the support structure 302. The non-angled elongated semiconductor structures 304 shown in FIGS. 3A-3B are parallel because their longitudinal axes 320 are parallel to one another (only one such longitudinal axis 320 is shown in each of FIGS. 3A-3B in order to not clutter the drawings). The elongated semiconductor structures 304 shown in FIGS. 3A-3B are "non-angled" because their longitudinal axes 320 are at angles of either 0 degrees or 90 degrees with respect to all edges 303 of the support structure 302. For example, in FIG. 3A, the longitudinal axes 320 are at an angle of 0 degrees with respect to each of the edges 303-1 and 303-3 and are at an angle of 90 degrees with respect to each of the edges 303-2 and 303-4, while, in FIG. 3B, the longitudinal axes 320 are at an angle of 90 degrees with respect to each of the edges 303-1 and 303-3 and are at an angle of 0 degrees with respect to each of the edges 303-2 and 303-4. One or more transistors (e.g., transistors 110 and/or FinFETs 210) may be formed along any and each of the non-angled elongated semiconductor structures 304, thus forming non-angled transistors as described herein.

As shown in FIGS. 4A-4B, a plurality of parallel angled elongated semiconductor structures 306 may be provided over the support structure 302. The angled elongated semiconductor structures 306 shown in FIGS. 4A-4B are parallel because their longitudinal axes 320 are parallel to one another (only one such longitudinal axis 320 is shown in each of FIGS. 4A-4B in order to not clutter the drawings). The elongated semiconductor structures 306 shown in FIGS. 4A-4B are "angled" because their longitudinal axes 320 are at angles of neither 0 degrees nor 90 degrees with respect to any of the edges 303 of the support structure 302. In particular, in each of FIGS. 4A-4B, the longitudinal axes 320 are at an angle between about 10 degrees and 80 degrees with respect to each of the edges 303. One or more transistors (e.g., transistors 110 and/or FinFETs 210) may be formed along any and each of the angled elongated semiconductor structures 306, thus forming angled transistors as described herein.

Figures 5A, 5B, 5C:
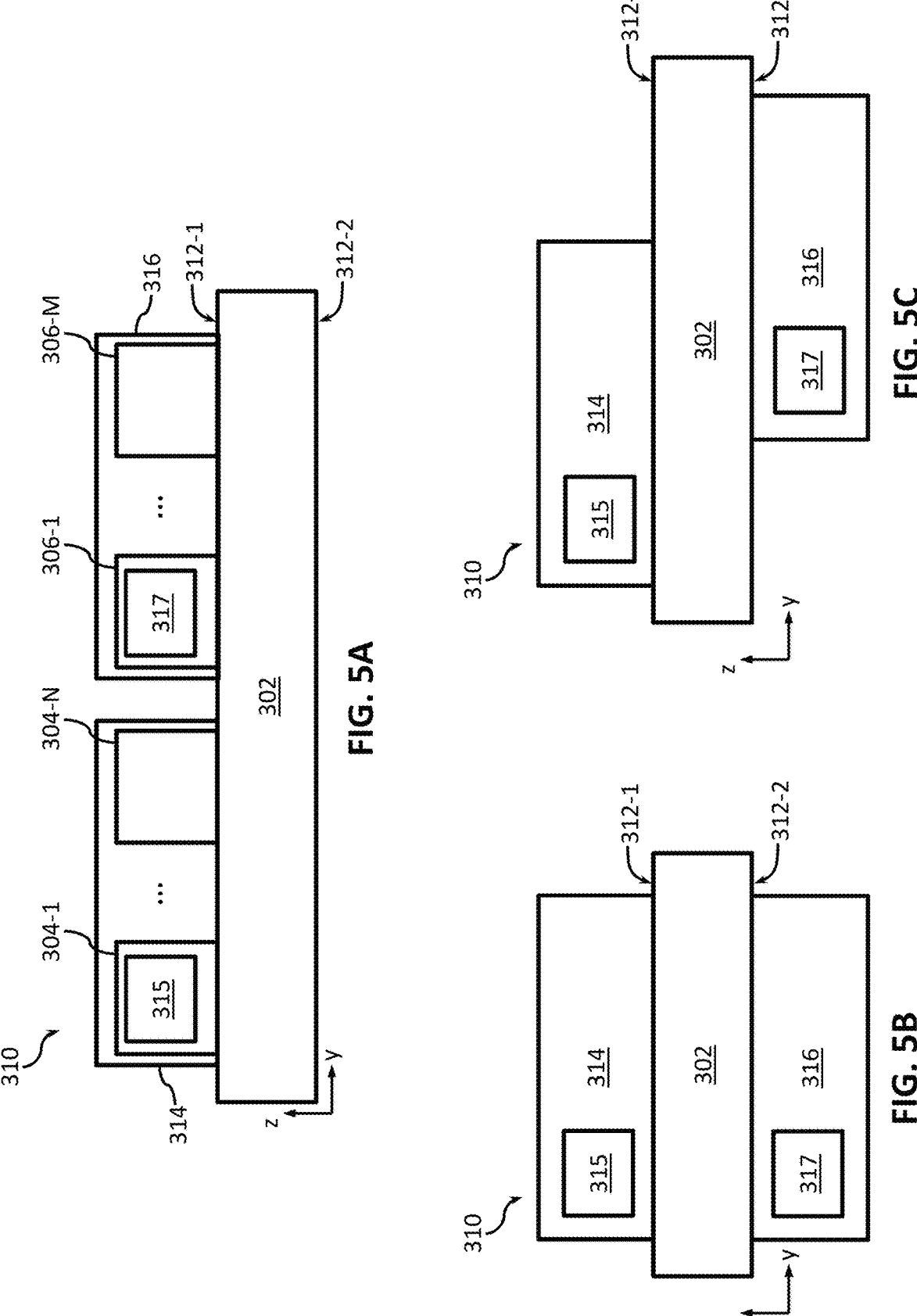
FIGS. 5A-5Q provide schematic illustrations of cross-sectional side views of example IC devices integrating non-angled and angled transistors, in accordance with some embodiments.
Figures 5D, 5E, 5F:
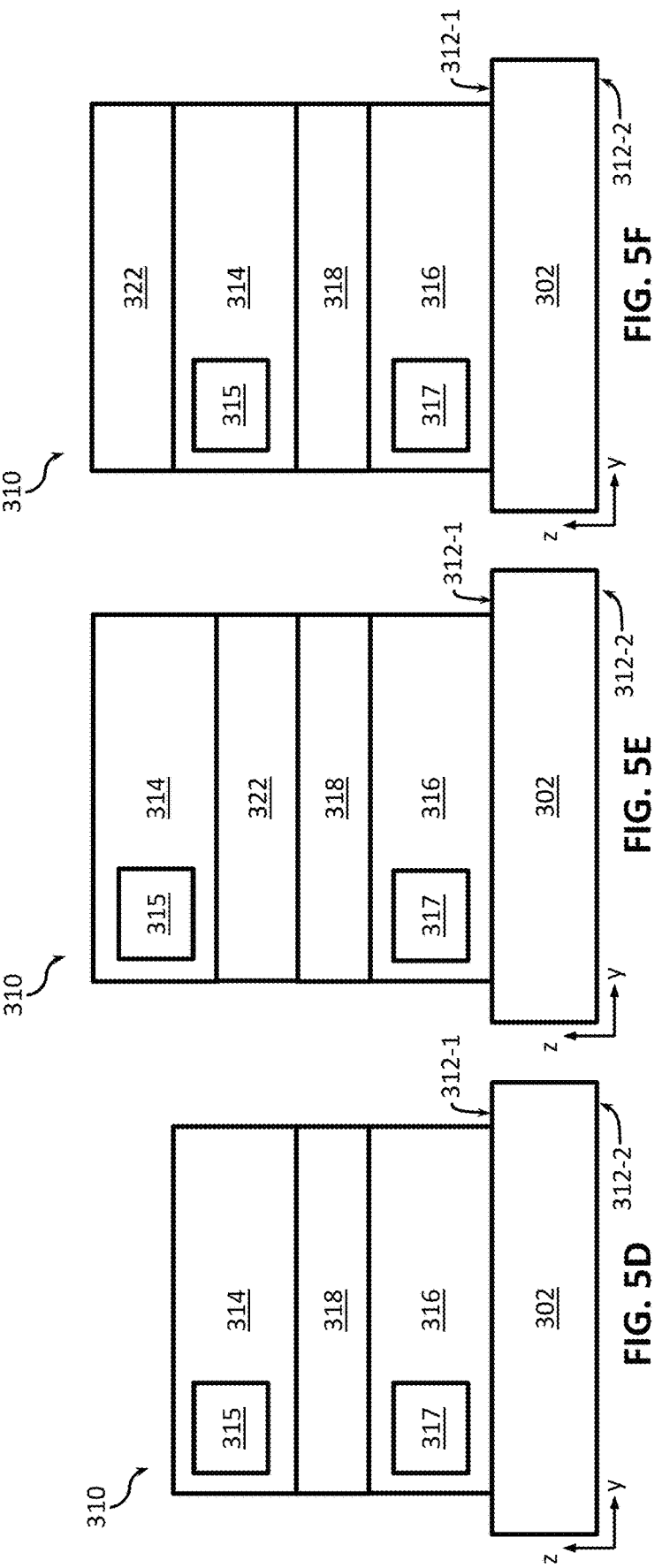
Figures 5G, 5H, 5I:
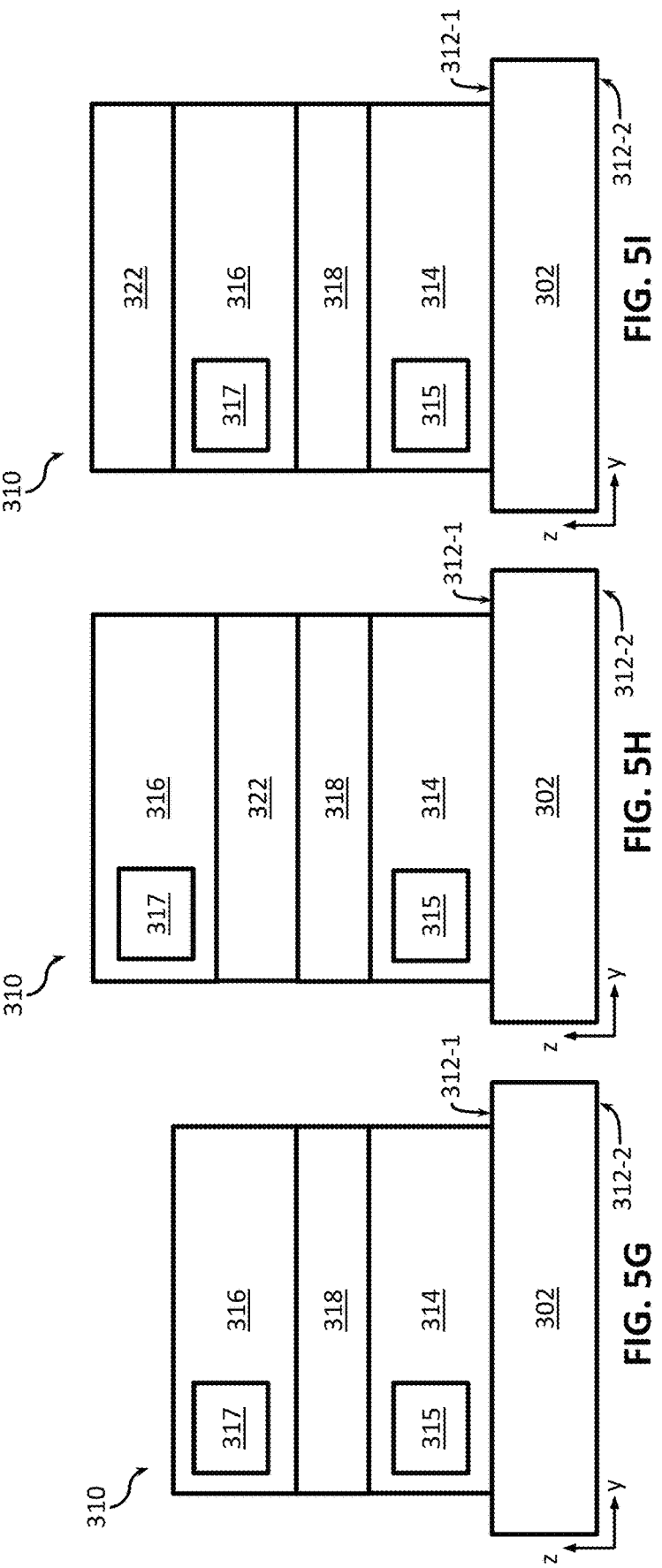
Figures 5J, 5K, 5L:
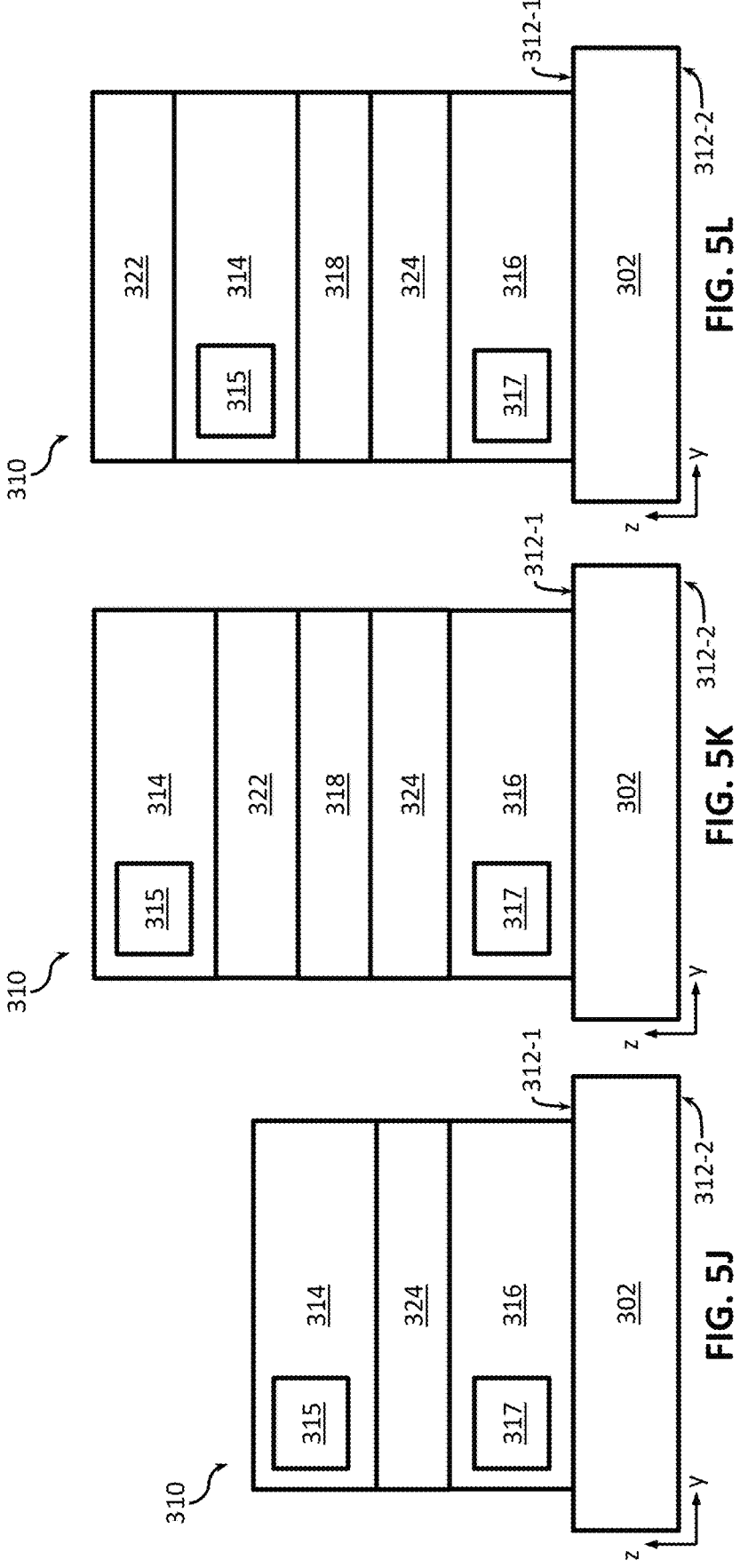
Figures 5M, 5N, 5O:
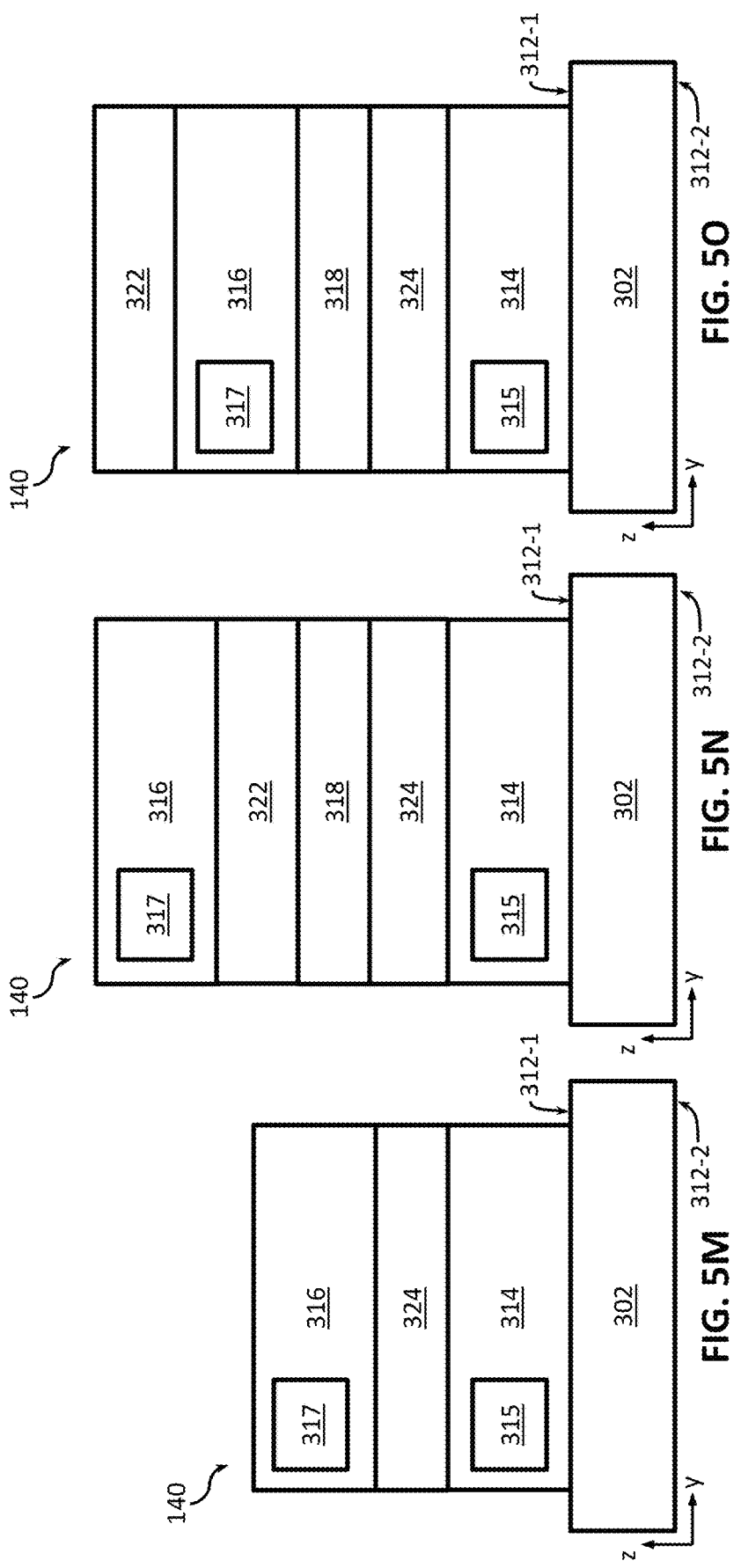
Figures 5P, 5Q:
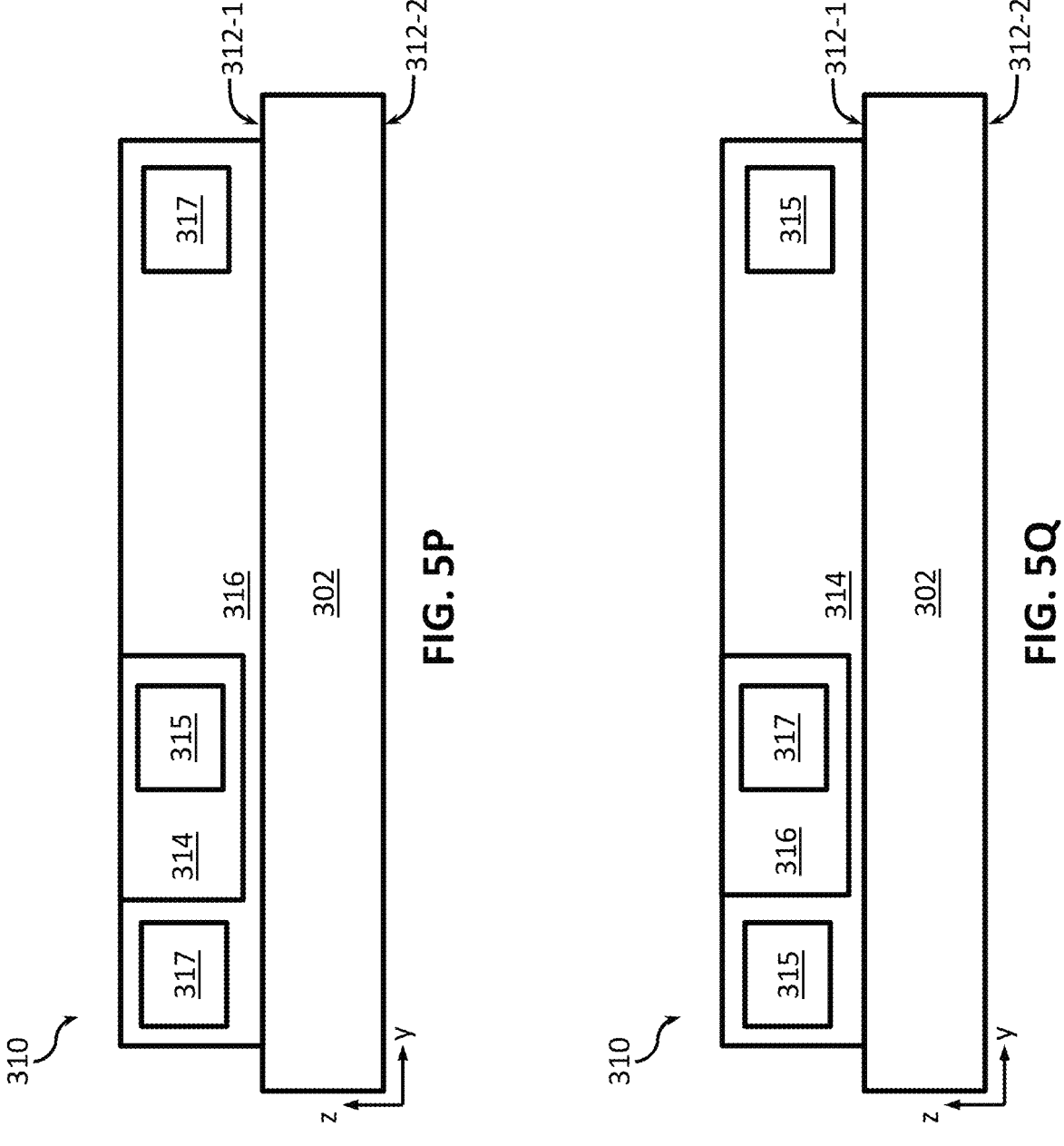

In various embodiments, both the non-angled elongated semiconductor structures 304 and the angled elongated semiconductor structures 306 may be provided over a single support structure 302, with some examples of such embodiments shown in FIGS. 5A-5Q.

FIGS. 5A-5Q provide schematic illustrations of cross-sectional side views of example IC devices 310 integrating non-angled and angled transistors, in accordance with some embodiments. The IC devices 310 may be examples of a combination of the IC devices 300 shown in FIGS. 3A-3B and the IC devices 300 shown in FIGS. 4A-4B. To that end, FIGS. 5A-5Q illustrate some of the same reference numerals as those shown in FIGS. 3A-3B and FIGS. 4A-4B to indicate similar or analogous elements as those that were described with reference FIGS. 3A-3B and FIGS. 4A-4B, so that descriptions of those are not repeated for FIGS. 5A-5Q. Each of the IC devices 310 illustrates the support structure 302, as described above, the support structure having a first face 312-1 and a second face 312-2 (the second face 312-2 being opposite the first face 312-1, where one of the faces 312 may be the front face/side of the support structure 302 and the other one of the faces 312 may be the back face/side of the support structure 302), a layer 314 of non-angled elongated semiconductor structures (referred to in the following as a "non-angled layer 314)" with at least one non-angled transistor 315, and a layer 316 of angled elongated semiconductor structures (referred to in the following as an "angled layer 316)" with at least one angled transistor 317.

FIG. 5A illustrates the details of the non-angled layer 314 and the angled layer 316. In particular, FIG. 5A illustrates that the non-angled layer 314 may include N non-angled elongated semiconductor structures 304 as described with reference to FIGS. 3A-3B, and that at least one of the N non-angled elongated semiconductor structures 304 may include a non-angled transistor 315. FIG. 5A further illustrates that the angled layer 316 may include M angled elongated semiconductor structures 306 as described with reference to FIGS. 4A-4B, and that at least one of the M angled elongated semiconductor structures 306 may include an angled transistor 317. Each of N and M may be an integer equal to or greater than one.

In order to not clutter the drawings, the details of the non-angled layer 314 and the angled layer 316 are only shown in FIG. 5A and FIGS. 5B-5Q only illustrate these layers and one example transistor in each of these layers. Furthermore, although FIGS. 5A-5Q only illustrate one non-angled transistor 315 in the non-angled layer 314 and one angled transistor 317 in the angled layer 316, this is also only in order to not clutter the drawings, and in various other embodiments of the IC devices 310, any of the N non-angled elongated semiconductor structures 304 of the non-angled layer 314 may include any number of zero or more non-angled transistor 315 and any of the M angled elongated semiconductor structures 306 of the angled layer 316 may include any number of zero or more angled transistor 317. Any of the non-angled transistors 315 may be formed along any of the non-angled elongated semiconductor structures 304 as, e.g., the nanoribbon transistor 110 or the FinFET 210 (possibly coupled to the storage element 166/266, as described above), and any of the angled transistors 317 may be formed along any and each of the angled elongated semiconductor structures 306 as, e.g., the nanoribbon transistor 110 or the FinFET 210 (possibly coupled to the storage element 166/266, as described above). Thus, any of the non-angled transistors 315 and the angled transistors 317 may include a source region (e.g., one of the S/D regions 114/214), a drain region (e.g., another one of the S/D regions 114/214), and a channel region (e.g., a portion of the nanoribbon 104 or the fin 204 that is wrapped by the gate stack 106/206) spatially between the source region and the drain region, as described above, where, for the non-angled transistor 315, the shortest line extending between the source region and the drain region (i.e., the longitudinal axis 120/220) is substantially parallel to at least one of the edges 303 of the support structure 302, and, for the angled transistor 317, the shortest line extending between the source region and the drain region (i.e., the longitudinal axis 120/220) is at an angle between 10 degrees and 80 degrees with respect to the same one of the edges 303 of the support structure 302. The edges 303 are not shown in FIGS. 5A-5Q, but these are the edges 303 as shown in FIGS. 3 and 4 and are the edges of either the first face 312-1 or the second face 312-2 of the support structure 302 shown in FIGS. 5A-5Q.

FIG. 5A illustrates an embodiment where the non-angled transistor 315 is provided over a first region of the first face 312-1 of the support structure 302 and the angled transistor 317 is provided over a second region, not overlapping with the first region, of the first face 312-1 of the support structure 302 (i.e., both the non-angled transistor 315 and the angled transistor 317 are provided over the same face 312-1, or on the same side, of the support structure 302, side-by-side with one another).

In some embodiments of the IC device 310 of FIG. 5A, the support structure 302 may be a substrate of a semiconductor material or may be a substrate having a surface that includes a layer of a semiconductor material, and the transistors 315 and 317 may be monolithically formed on the same face 312 of the support structure 302 so that channel regions of these transistors include the semiconductor material of the support structure 302. In other embodiments of the IC device 310 of FIG. 5A, some of the transistors 315 and 317 may be monolithically formed on the first face 312-1 of the support structure 302 while some others may be provided over the same face 312-1 using the layer transfer process, as described above. In still other embodiments of the IC device 310 of FIG. 5A, all the transistors 315 and 317 may be provided over the same face 312-1 using the layer transfer process. Unless described otherwise, these variations are generally applicable to other embodiments of the IC device 310 as shown in FIGS. 5B-5Q, with the modification that the transistors 315 and 317 do not have to be provided over the same face in a side-by-side manner as shown in FIG. 5A but are provided as shown in FIGS. 5B-5Q.

FIGS. 5B and 5C illustrate embodiments of the IC devices 310 where the transistors 315 and 317 are provided on the opposite faces 312, e.g., the non-angled transistor 315 may be provided over the first face 312-1, while the angled transistor 317 may be provided over the second face 312-2. For example, in some embodiments, the support structure may 302 be a substrate of a semiconductor material or may be a substrate having a surface of the first face 312-1 and a surface of the second face 312-2 that includes a layer of a semiconductor material, and the non-angled and angled transistors 315, 317 may be monolithically formed on different faces 312 of the support structure 302 so that channel regions of these transistors include the semiconductor material. The embodiments of FIGS. 5B and 5C may differ in where projections of the transistors 315, 317 onto the support structure 302 (i.e., footprints of the transistors 315, 317) may be located with respect to one another. In particular, FIG. 5B illustrates an embodiment where a projection of the angled transistor 317 onto the support structure 302 fully overlaps with, or is within, a projection of the non-angled transistor 315 onto the support structure 302 or the projection of the non-angled transistor 315 onto the support structure 302 fully overlaps with, or is within, the projection of the angled transistor 317 onto the support structure 302. On the other hand, FIG. 5C illustrates an embodiment where a projection of the angled transistor 317 onto the support structure 302 is offset with respect to (e.g., does not overlap, or overlaps by less than about 75%, e.g., overlaps by less than about 25%) a projection of the non-angled transistor 315 onto the support structure 302. In some embodiments, any of the transistors 315, 317 of the IC devices 310 of FIGS. 5A-5C may be monolithically integrated on the support structure 302, so that the channel regions of these transistors include the channel materials that are from different portions of the semiconductor material of the support structure 302.

FIGS. 5D-5O illustrate embodiments of the IC devices 310 where the non-angled and angled layers 314 and 316 are provided over the same face 312 (e.g., the first face 312-1) of the support structure 302, stacked above one another, with a bonding layer 318 and/or a redistribution layer (RDL) 324 therebetween. Such embodiments may be advantageous in terms of, e.g., reducing parasitic effects and/or reducing delay in exchanging signals between the transistors and other devices of the non-angled and angled layers 314 and 316 because no support structure 302 is present between these layers.

FIGS. 5D-5I, 5K-5L, and 5N-5O illustrate embodiments where the non-angled transistor 315 is in a first layer over the first face 312-1 of the support structure 302, the angled transistor 317 is in a second layer over the first face 312-1 of the support structure 302 (i.e., the first and second layers are over the same face 312-1 of the support structure 302 and are closer to the first face 312-1 of the support structure 302 than to the second face 312-2 of the support structure 302), and the IC device further includes a bonding layer 318 between the first layer and the second layer. The IC devices 310 of FIGS. 5D-5I, 5K-5L, and 5N-5O may be fabricated by forming the non-angled layer 314 with one or more non-angled transistors 315 on a first IC die, forming the angled layer 316 with one or more angled transistors 317 on a second IC die, and then bonding these two IC dies together using hybrid bonding, with a bonding layer 318 therebetween. For example, the IC devices 310 of FIGS. 5D-5I, 5K-5L, and 5N-5O may be fabricated using hybrid manufacturing, where the non-angled layer 314 is first formed on a first IC die, the angled layer 316 is formed on a second IC die, and these two IC dies are then bonded together using hybrid manufacturing, with a bonding layer 318 therebetween. As used herein, "hybrid manufacturing" refers to fabricating an IC device (e.g., a microelectronic assembly)

by bonding together at least two IC dies fabricated by different manufacturers, using different materials, or different manufacturing techniques. In some embodiments, bonding of the faces of the first and second IC dies may be performing using insulator-insulator bonding, e.g., as oxide-oxide bonding, where an insulating material of the first IC die is bonded to an insulating material of the second IC die. In some embodiments, the bonding material 318 may be present in between the faces of the first and second IC dies that are bonded together. To that end, the bonding material may be applied to the one or both faces of the first and second IC dies that should be bonded and then the first and second IC dies are put together, possibly while applying a suitable pressure and heating up the assembly to a suitable temperature (e.g., to moderately high temperatures, e.g., between about 50 and 200 degrees Celsius) for a duration of time. In some embodiments, the bonding material 318 may be an adhesive material that ensures attachment of the first and second IC dies to one another. In some embodiments, the bonding material 318 may be an etch-stop material. In some embodiments, the bonding material 318 may be both an etch-stop material and have suitable adhesive properties to ensure attachment of the first and second IC dies to one another. In some embodiments, the bonding material 318 may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, could be a characteristic feature of the hybrid bonding. Using an etch-stop material at the interface (i.e., the interface between the first and second IC dies) that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the first and second IC dies together. In addition, an etch-stop material at the interface between the first and second IC dies that includes include silicon, nitrogen, and carbon, where the atomic percentage of any of these materials may be at least 1%, may be advantageous in terms of improving etch selectivity of this material with respect to etch-stop materials that may be used in different of the first and second IC dies. In some embodiments, no bonding material 318 may be used, but there will still be a bonding interface resulting from the bonding of the first and second IC dies to one another. Such a bonding interface may be recognizable as a seam or a thin layer in the microelectronic assembly, using, e.g., selective area diffraction (SED), even when the specific materials of the insulators of the first and second IC dies that are bonded together may be the same, in which case the bonding interface would still be noticeable as a seam or a thin layer in what otherwise appears as a bulk insulator (e.g., bulk oxide) layer.

The embodiments of FIGS. 5D-5I, 5K-5L, and 5N-5O differ in whether the non-angled transistors 315 or the angled transistors 317 are at the bottom of the stack (i.e., closer to the support structure 302), and whether the bonding is a face-to-face (F2F) bonding or face-to-back (F2B) bonding between the non-angled and angled layers 314 and 316.

FIGS. 5D-5F and FIGS. 5K-5L illustrate that the angled layer 316 and, therefore, the angled transistor 317, may be at the bottom of the stack (i.e., closer to the first face 312-1 of the support structure 302 than the non-angled layer 314 and, therefore, than the non-angled transistors 315).

FIG. 5D illustrates an embodiment there the bonding layer 318 may be in between and in contact with each of the angled layer 316 at the bottom of the bonding layer 318 and the non-angled layer 314 at the top of the bonding layer 318.

FIG. 5E illustrates an embodiment, where a metallization stack 322 may be present between (e.g., in contact with each of) the bonding layer 318 and the non-angled layer 314. As is known in the art, a metallization stack refers to a collection of several levels, or several layers, in which electrically conductive lines are provided, with electrically conductive vias providing electrical connectivity between conductive lines of different layers. Together, electrically conductive lines and vias may be referred to as "interconnects," where the term "interconnect" may be used to describe any element formed of an electrically conductive material for providing electrical connectivity to one or more components associated with an IC or/and between various such components. In context of an IC die/chip, the term "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of the IC die/chip. On the other hand, the term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in not adjacent levels. Sometimes, metal lines and vias may be referred to as "conductive lines/traces" and "conductive vias", respectively, to highlight the fact that these elements include electrically conductive materials such as, but not limited to, metals. Metallization stacks are typically provided in back end of line (BEOL) layers of an IC die, i.e., in layers that are further away from the die than front-end of line (FEOL) layers where front-end transistors are implemented. Therefore, presence of the metallization stack 322 between the bonding layer 318 and the non-angled layer 314, and the bonding layer 318 being between the metallization stack 322 and the angled layer 316 may be indicative of the metallization stack 322 being originally (i.e., before bonding) a part of a first IC die that includes the non-angled layer 314 with the metallization stack 322 being originally on top of the non-angled layer 314, where the first IC die is then bonded, face down, to the front face of a second IC die that includes the angled layer 316. In other words, FIG. 5E illustrates an embodiment of a F2F bonding between the non-angled and angled layers 314, 316, with the angled layer 316 being at the bottom (i.e., closer to the support structure 302).

FIG. 5F illustrates an embodiment, where the non-angled layer 314 is between (e.g., in contact with each of) the bonding layer 318 and the metallization stack 322. Presence of the non-angled layer 314 between the bonding layer 318 and the metallization stack 322 may be indicative of the metallization stack 322 being originally (i.e., before bonding) a part of a first IC die that includes the non-angled layer 314 with the metallization stack 322 being on top of the non-angled layer 314, where the first IC die is then bonded, back side down, to the front face of a second IC die that includes the angled layer 316. In other words, FIG. 5F illustrates an embodiment of a F2B bonding between the angled layer 316 and the non-angled layer 314, with the angled layer 316 being at the bottom (i.e., closer to the support structure 302). This may be done as follows. Once the non-angled layer 314 is formed over the first IC die, and the metallization stack 322 is formed over the non-angled layer 314, a carrier substrate may be attached to the top of the first IC die (e.g., the carrier substrate may be attached so that the metallization stack 322 is between the non-angled layer 314 and the carrier substrate). Such a carrier substrate may be any support structure capable of providing mechanical stability to the non-angled layer 314 and the metallization stack 322. The first IC die may then be flipped over (i.e., placing the carrier substrate at the bottom for further processing) so that the first IC die may be thinned (e.g., gradually removed) from the back side, e.g., thinned until the non-angled layer 314 is exposed. At this point, the carrier substrate may provide the mechanical stability to the arrangement. Such a first IC die with the non-angled layer 314 being exposed from the back side of the first IC die may then be bonding to the front side (e.g., to the angled layer 316) of the second IC die.

FIGS. 5G-5I and FIGS. 5N-5O illustrate that the non-angled layer 314 and, therefore, the non-angled transistor 315, may be at the bottom of the stack (i.e., closer to the first face 312-1 of the support structure 302 than the angled layer 316 and, therefore, than the angled transistors 317).

FIG. 5G illustrates an embodiment there the bonding layer 318 may be in between and in contact with each of the non-angled layer 314 at the bottom and the angled layer 316 at the top of the bonding layer 318 (i.e., FIG. 5G is similar to FIG. 5D but with the top and bottom layers with respect to the bonding layer 318 being reversed).

FIG. 5H illustrates an embodiment, where a metallization stack 322 may be present between (e.g., in contact with each of) the bonding layer 318 and the angled layer 314. The presence of the metallization stack 322 between the bonding layer 318 and the angled layer 316, and the bonding layer 318 being between the metallization stack 322 and the non-angled layer 314 may be indicative of the metallization stack 322 being originally (i.e., before bonding) a part of a second IC die that includes the angled layer 316 with the metallization stack 322 being originally on top of the angled layer 316, where the second IC die is then bonded, face down, to the front face of a first IC die that includes the non-angled layer 314. In other words, FIG. 5H illustrates an embodiment of a F2F bonding between the non-angled and angled layers 314, 316, with the non-angled layer 314 being at the bottom (i.e., closer to the support structure 302).

FIG. 5I illustrates an embodiment, where the angled layer 316 is between (e.g., in contact with each of) the bonding layer 318 and the metallization stack 322. Presence of the angled layer 316 between the bonding layer 318 and the metallization stack 322 may be indicative of the metallization stack 322 being originally (i.e., before bonding) a part of a second IC die that includes the angled layer 316 with the metallization stack 322 being on top of the angled layer 316, where the second IC die is then bonded, back side down, to the front face of a first IC die that includes the non-angled layer 314. In other words, FIG. 5I illustrates an embodiment of a F2B bonding between the angled layer 316 and the non-angled layer 314, with the non-angled layer 314 being at the bottom (i.e., closer to the support structure 302). This may be done as follows. Once the angled layer 316 is formed over the second IC die, and the metallization stack 322 is formed over the angled layer 316, a carrier substrate may be attached to the top of the second IC die (e.g., the carrier substrate may be attached so that the metallization stack 322 is between the angled layer 316 and the carrier substrate). Such a carrier substrate may be any support structure capable of providing mechanical stability to the angled layer 316 and the metallization stack 322. The second IC die may then be flipped over (i.e., placing the carrier substrate at the bottom for further processing) so that the second IC die may be thinned (e.g., gradually removed) from the back side, e.g., thinned until the angled layer 316 is exposed. At this point, the carrier substrate may provide the mechanical stability to the arrangement. Such a second IC die with the angled layer 316 being exposed from the back side of the second IC die may then be bonding to the front side (e.g., to the non-angled layer 314) of the first IC die.

FIGS. 5J-5O illustrate embodiments where, similar to FIGS. 5D-5I, there is no support structure 302 between the non-angled and angled layers 314, 316, but where a RDL 324 is present therebetween.

FIG. 5J illustrates an embodiment there the RDL 324 may be in between and in contact with each of the angled layer 316 at the bottom of the RDL 324 and the non-angled layer 314 at the top of the RDL 324. The RDL 324 may be similar to the bonding layer 318 in that it may provide means for mechanically attaching the angled layer 316 and the non-angled layer 314 together. However, in addition to mechanical stability, as the name "RDL" suggests, it contains interconnects that provide electrical connectivity between IC components of the angled layer 316 (angled transistors 317 being one non-limiting example of such IC components) and IC components of the non-angled layer 314 (non-angled transistors 315 being one non-limiting example of such IC components). To that end, the RDL 324 may include any arrangement of interconnects (i.e., conductive vias and/or conductive lines), configured to provide such electrical connectivity. In some embodiments, the RDL 324 may be implemented using staggered via formation, as described below with reference to FIG. 9.

FIG. 5K illustrates an embodiment of the IC device 310 similar to that shown in FIG. 5E, except that it further includes the RDL 324 between (e.g., in contact with each of) the angled layer 316 and the bonding layer 318, so the bonding layer 318 is now between (e.g., in contact with each of) the RDL 324 and the metallization stack 322.

FIG. 5L illustrates an embodiment of the IC device 310 similar to that shown in FIG. 5F, except that it also further includes the RDL 324 between (e.g., in contact with each of) the angled layer 316 and the bonding layer 318, so the bonding layer 318 is now between (e.g., in contact with each of) the RDL 324 and the non-angled layer 314.

FIG. 5M illustrates an embodiment there the RDL 324 may be in between and in contact with each of the non-angled layer 314 at the bottom of the RDL 324 and the angled layer 316 at the top of the RDL 324.

FIG. 5N illustrates an embodiment of the IC device 310 similar to that shown in FIG. 5H, except that it further includes the RDL 324 between (e.g., in contact with each of) the non-angled layer 314 and the bonding layer 318, so the bonding layer 318 is now between (e.g., in contact with each of) the RDL 324 and the metallization stack 322.

FIG. 5O illustrates an embodiment of the IC device 310 similar to that shown in FIG. 5I, except that it also further includes the RDL 324 between (e.g., in contact with each of) the non-angled layer 314 and the bonding layer 318, so the bonding layer 318 is now between (e.g., in contact with each of) the RDL 324 and the angled layer 316.

FIGS. 5P and 5Q illustrate embodiments of the IC devices 310 where the transistors 315 and 317 are provided on the same face 312 of the support structure 302 (e.g., on the first face 312-1) but some may be nested within the others. In particular, FIG. 5P illustrates an embodiment where the angled transistor 317 is one of a plurality of angled transistors 317 provided over the first face 312-1 of the support structure 302 and the non-angled transistor 315 is nestled among the plurality of angled transistors 317. On the other hand, FIG. 5Q illustrates an embodiment where the non-angled transistor 315 is one of a plurality of non-angled transistors 315 provided over the first face 312-1 of the support structure 302 and the angled transistor 317 is nestled among the plurality of non-angled transistors 315. In some embodiments, any of the transistors 315, 317 of the IC devices 310 of FIGS. 5P and 5Q may be monolithically integrated on the support structure 302, so that the channel regions of these transistors include the channel materials that are from different portions of the semiconductor material of the support structure 302.

IC devices with angled transistors, disclosed herein, may be manufactured using a method that may be referred to as "trim patterning," where FIGS. 6A-6H provide top-down views of various processes of such a method, in accordance with some embodiments, and where FIGS. 6A-7B provide some alternative arrangements that could be realized using the method of FIGS. 6A-6H.

The IC devices shown in FIGS. 6-7 are intended to show relative arrangements of some of the components therein, and these IC devices, or portions thereof, may include other components that are not illustrated. For example, although not specifically illustrated in FIGS. 6-7, the IC devices shown in these drawings may include transistors implemented in, or based on, the angled elongated semiconductor structures shown, which transistors would include gate stacks, S/D regions, and other portions, e.g., as described above with reference to FIGS. 1 and 2. In another example, although not specifically illustrated in FIGS. 6-7, at least portions of the angled elongated semiconductor structures, or portions of other elements shown in FIGS. 6-7, may be surrounded in an insulator material, such as any suitable ILD material. The angled elongated semiconductor structures shown in FIGS. 6-7 may be part of any of the IC devices 310, described with reference to FIG. 5 (e.g., any of the transistors 317 shown in FIG. 5 may be implemented based on any of the angled elongated semiconductor structures shown in FIGS. 6-7), even though the integration of the angled elongated semiconductor structures with non-angled elongated semiconductor structures, explained with reference to FIG. 5, is not shown in FIGS. 6-7.

Although the operations of the manufacturing method illustrated in FIG. 6 are illustrated once each and in a particular order, the operations may be performed in any suitable order and repeated as desired. For example, the operations may be performed in a different order to reflect the structure of an IC device in which an angled transistor will be included. In addition, the example manufacturing method illustrated in FIG. 6 may include other operations not specifically shown in the drawings, such as various cleaning or planarization operations as known in the art. For example, in some embodiments, a support structure, as well as layers of various other materials subsequently deposited thereon, may be cleaned prior to, after, or during any of the processes of the manufacturing method illustrated in FIG. 6, e.g., to remove oxides, surface-bound organic and metallic contaminants, as well as subsurface contamination. In some embodiments, cleaning may be carried out using, e.g., a chemical solution (such as peroxide), and/or ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the manufacturing method illustrated in FIG. 6 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Figure 6A:
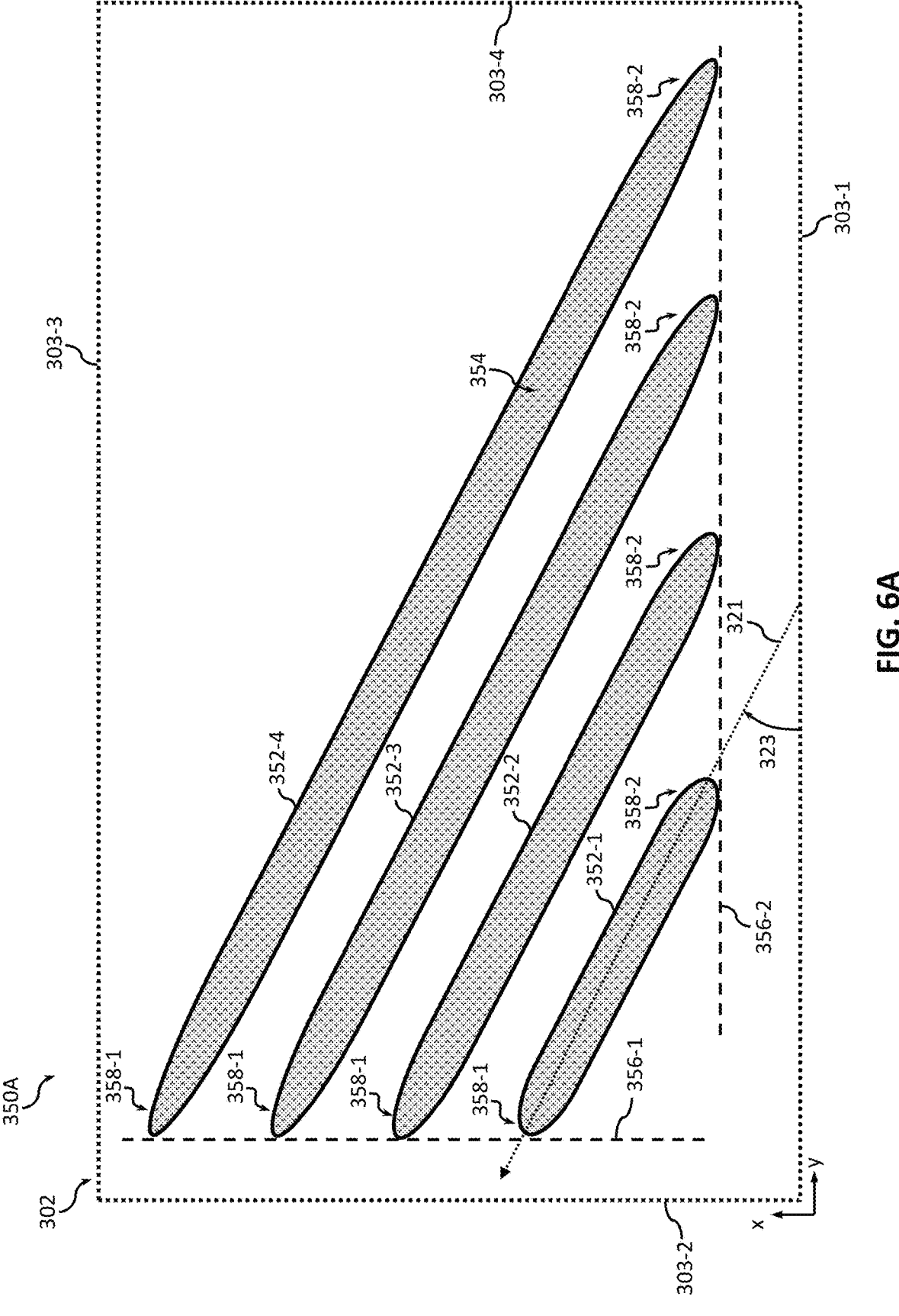
FIGS. 6A-6H provide top-down views of results of various processes of a trim patterning method of manufacturing an IC device with angled elongated semiconductor structures, in accordance with some embodiments.

FIG. 6A illustrates an IC device 350A, showing that the trim patterning method may begin with providing a support structure 302 (shown as a dotted rectangular contour) with edges 303, as described above, and providing angled elongated structures 352 of a backbone material 354 (labeled in FIG. 6A for only one of the structures 352 but shown with the same pattern for all the other structures 352 of FIG. 6A). As shown in FIG. 6A, a first alignment line 356-1 and a second alignment line 356-2 may be defined so that first ends 358-1 of the angled elongated structures 352 of the backbone material 354 may be aligned with the first alignment line 356-1, while the second ends 358-2 of the angled elongated structures 352 of the backbone material 354 may be aligned with the second alignment line 356-2. The angled elongated structures 352 are substantially parallel to one another and have their longitudinal axes 321 at an angle 323 with respect to the edge 303-1 (only one such longitudinal axis 321 and one angle 323 are shown in FIG. 6A in order to not clutter the drawing). The angle 323 is an acute angle because it is less than 90 degrees, e.g., it may be between about 5 and 45 degrees, e.g., between about 5 and 30 degrees or between about 10 and 25 degrees. The angled elongated structures 352 form basis of manufacturing angled elongated semiconductor structures, which will also be substantially at the angle 323 with respect to the edge 303-1.

Figure 6B:
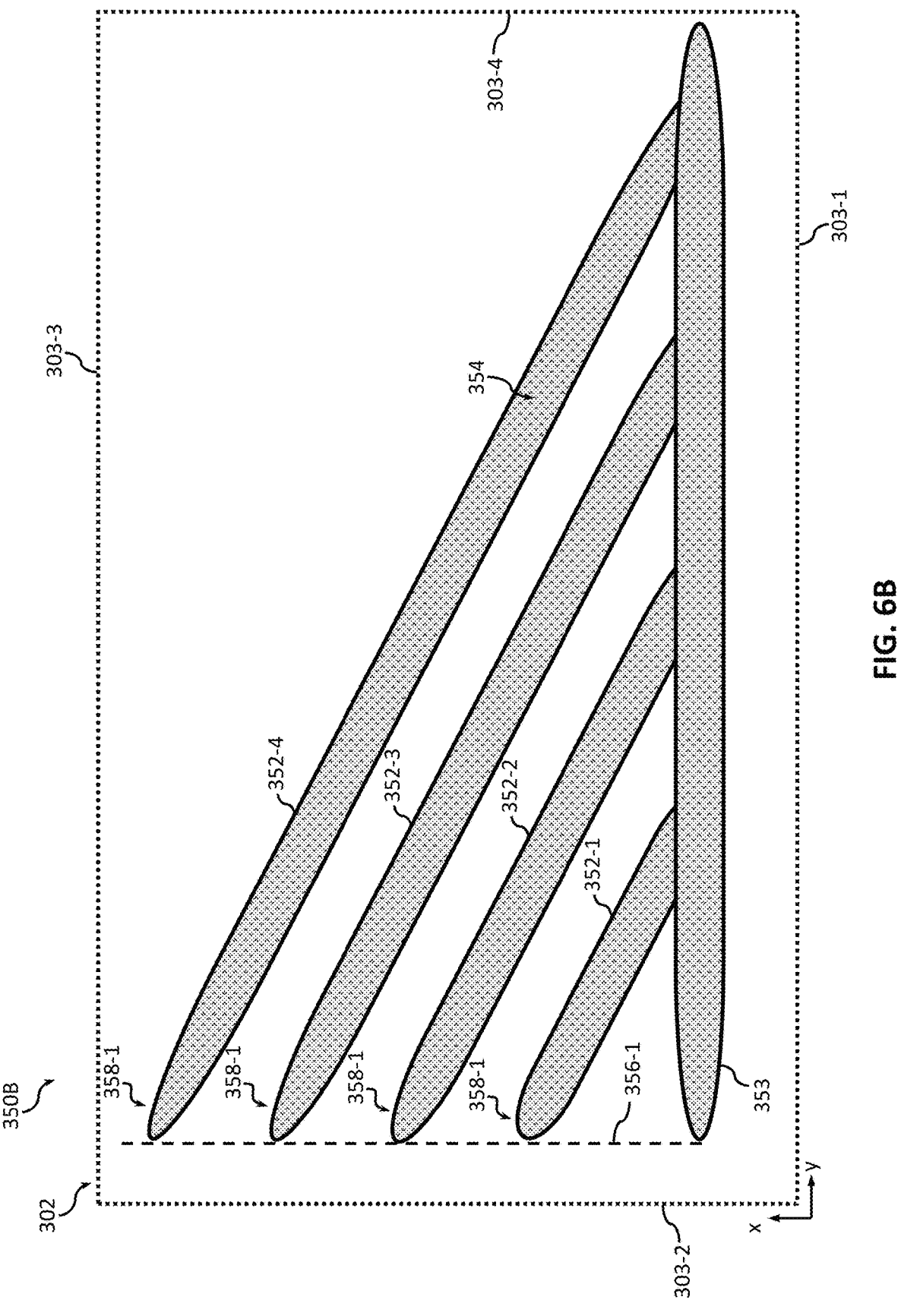

Inventors of the present disclosure realized that, when the angled elongated semiconductor structures are provided at an acute angle with respect to one of the edges 303 of the support structure 302, their fabrication may be assisted by using an additional structure of a backbone material that may extend substantially along the edge 303 with which the angled elongated semiconductor structures will form an acute angle. Such an additional structure is shown in FIG. 6B as an additional elongated structure 353 of the backbone material 354, provided so as to overlap with the second ends 358-2 of the angled elongated structures 352. The additional elongated structure 353 is not angled but is substantially parallel to the edge 303-1 with which the angled elongated structures 352 form acute angles 323.

Although shown in two separate drawings (i.e., in FIG. 6A and FIG. 6B), the angled elongated structures 352 and the additional elongated structure 353 of the backbone material 354 may be provided in a single fabrication step, using appropriate deposition and patterning techniques. For example, in some embodiments, the angled elongated structures 352 and the additional elongated structure 353 may be provided using any suitable patterning techniques, such as, but not limited to, photolithographic or electron-beam (e-beam) patterning, possibly in conjunction with a suitable etching technique, e.g., a dry etch, such as radio frequency (RF) reactive ion etch (RIE) or inductively coupled plasma (ICP) RIE. In some embodiments, the etch performed in this fabrication method may include an anisotropic etch, using etchants in a form of e.g., chemically active ionized gas (i.e., plasma) using e.g., bromine (Br) and chloride (CI) based chemistries. In some embodiments, during the etch of this method, the IC structure may be heated to elevated temperatures, e.g., to temperatures between about room temperature and 200 degrees Celsius, including all values and ranges therein, to promote that by-products of the etch are made sufficiently volatile to be removed from the surface.

Figure 6C:
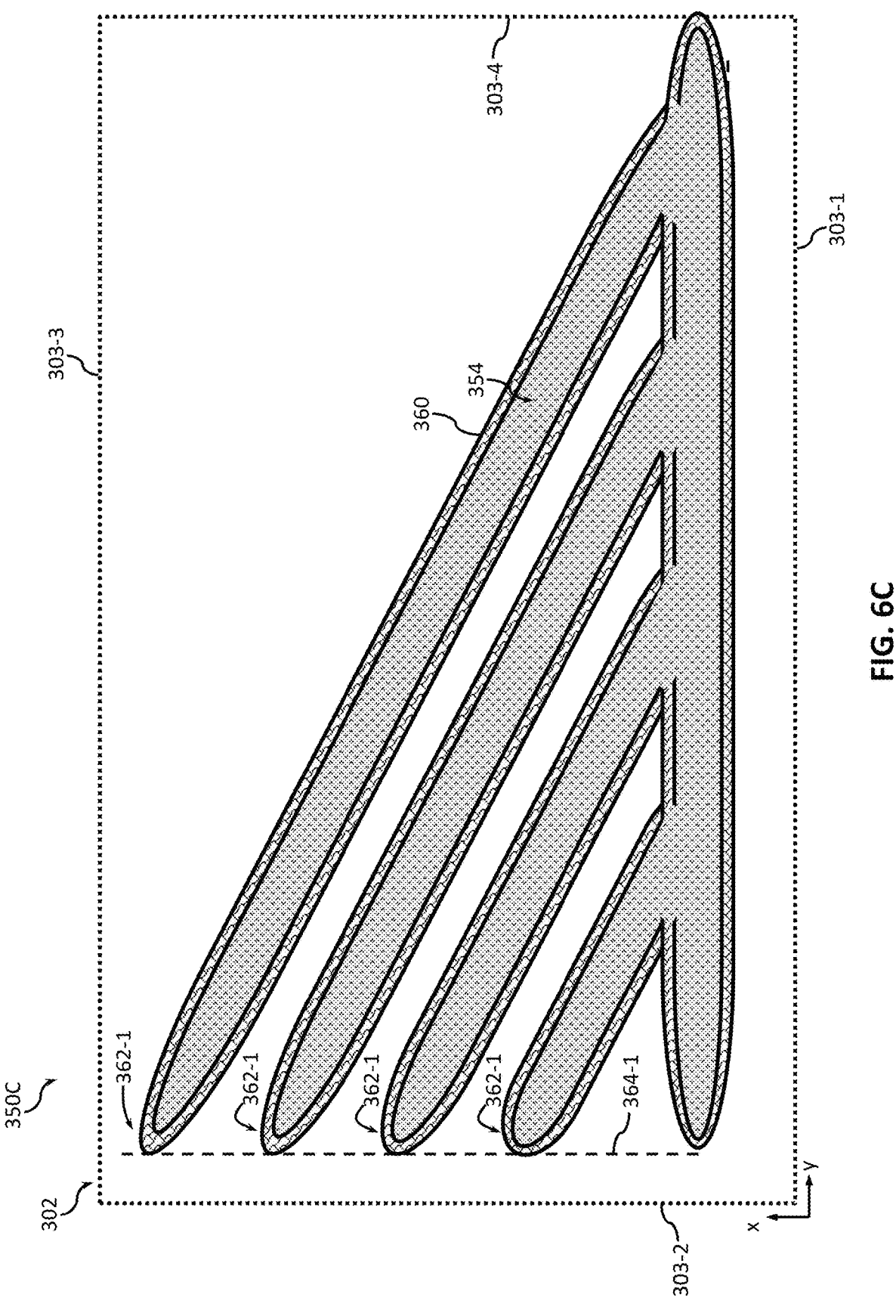

FIG. 6C illustrates an IC device 350C which is substantially the same as the IC device 350B (although not all reference numerals shown in FIG. 6B are repeated again in FIG. 6C in order to not clutter the drawing), showing that the method may continue with depositing a liner 360 on the sidewalls of the angled elongated structures 352 and the additional elongated structure 353. The liner 360 may be deposited on the sidewalls using any suitable conformal deposition technique such as atomic layer deposition (ALD), chemical vapor deposition (CVD), plasma enhanced CVD (PECVD), or/and physical vapor deposition (PVD) processes such as sputter. As a result of conformal deposition, a thickness of the liner 360 may be substantially the same along the sidewalls of the angled elongated structures 352 and the additional elongated structure 353. This means that new first ends 362-1 may be defined as the first ends 358-1 of the angled elongated structures 352 of the backbone material 354 with the liner 360 thereon. Similar to the first ends 358-1, the new first ends 362-1 may still be aligned, but now with a first alignment line 364-1, which is the first alignment line 356-1 moved by a distance corresponding to the thickness of the liner 360.

Figure 6D:
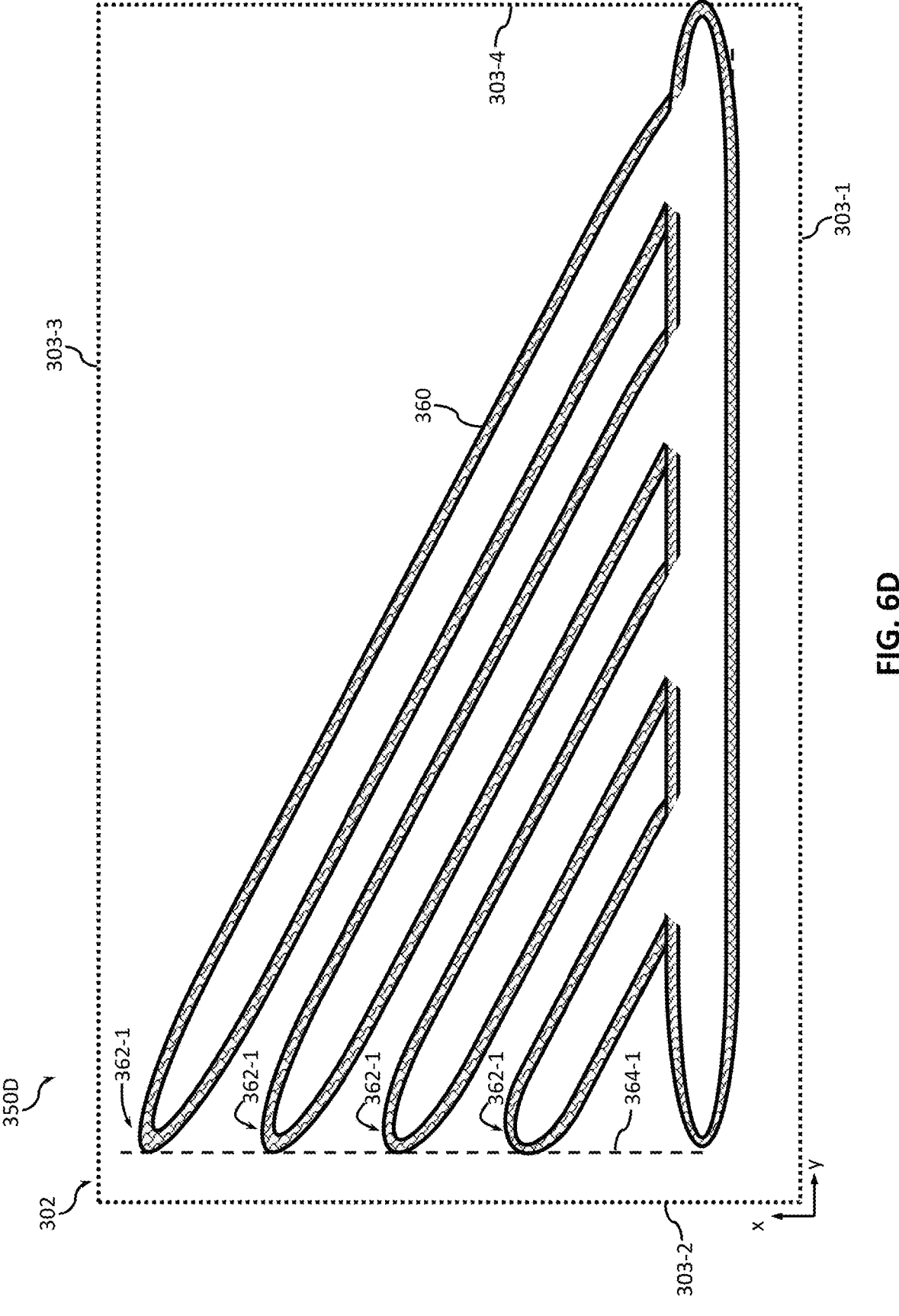

FIG. 6D illustrates an IC device 350D which is substantially the same as the IC device 350C (although not all reference numerals shown in FIGS. 6A-6C are repeated in FIG. 6D, in order to not clutter the drawing), showing that the method may continue with removing the backbone material 354, leaving only the liner 360 that was previously deposited on the sidewalls of the angled elongated structures 352 and the additional elongated structure 353. Such removal of the backbone material 354 without substantially removing the liner 360 may be performed using selective etching, provided that the backbone material 354 and the liner 360 have sufficient etch selectivity. As known in the art, two materials are said to have "sufficient etch selectivity" when etchants used to etch one material do not substantially etch the other, enabling selective etching of one material but not the other. Any suitable etching techniques, either anisotropic or isotropic, may be used to selectively remove the backbone material 354. An etch is described as "anisotropic" if etchants remove the material preferentially in one direction and not in all directions, whereas an etch is described as "isotropic" if the etchants can remove material by etching the material in different directions. Dry etch is an example of an anisotropic etch, while wet etch is an example of an isotropic etch.

Figure 6E:
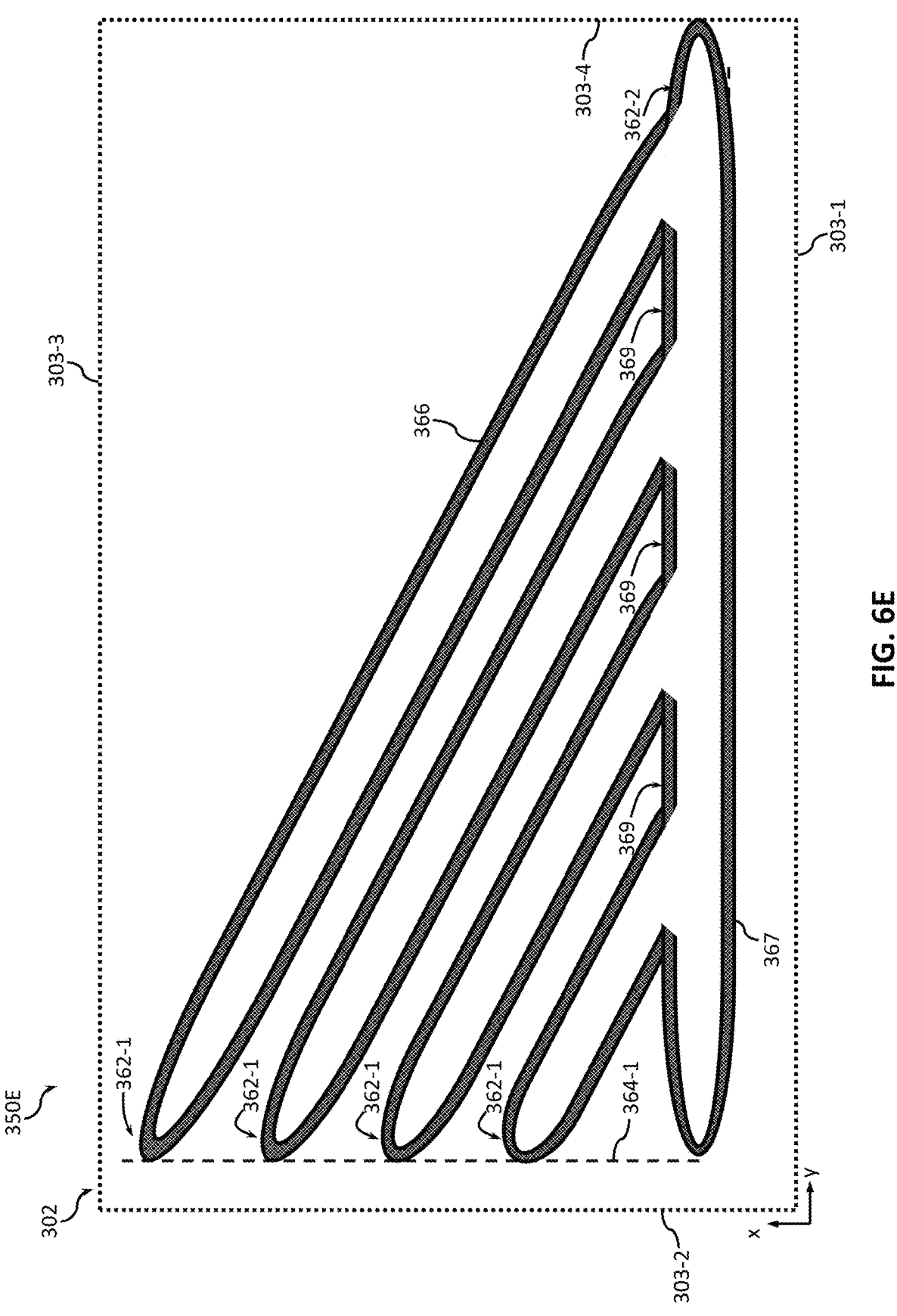

FIG. 6E illustrates an IC device 350E which is substantially the same as the IC device 350D (although not all reference numerals shown in FIGS. 6A-6D are repeated again in FIG. 6E, in order to not clutter the drawing), showing that the method may then proceed with using the pattern of the liner 360 of the IC device 350C as an etch mask to perform an anisotropic etch (e.g., a dry etch) to remove semiconductor material of the support structure 302 not covered by the etch mask. As a result, angled elongated semiconductor structures 366 may be formed, having shapes corresponding to those of the liner 360 deposited on sidewalls of the angled elongated structures 352. Furthermore, additional elongated semiconductor structures 367 and 369 may be formed, having shapes corresponding to those of the liner 360 deposited on sidewalls of the additional elongated structure 353. In particular, there may be a single additional elongated semiconductor structure 367 based on the sidewall of the additional elongated structure 353 that was closest to the edge 303-1 and a plurality of additional elongated semiconductor structures 369 may be formed based on portions of the sidewall of the additional elongated structure 353 that was in between various ones of the adjacent angled elongated semiconductor structures 366. Subsequently, the liner 360 may be removed as it has served its purpose, leaving only the angled elongated semiconductor structures 366 and the additional elongated semiconductor structures 367 and 369, as shown in FIG. 6E. Such fabrication method may be used when the angled elongated semiconductor structures 366 serve as a basis for forming the angled elongated semiconductor structures 306 by monolithic integration, using the semiconductor material of the support structure 302 as a channel material of the future angled transistors, as described above.

The substantially straight portions of the angled elongated semiconductor structures 366 of the IC device 350D may then serve as the angled elongated semiconductor structures that may be patterned to form angled transistors as described above. The additional elongated semiconductor structures 367 and 369 do not need to have any functional purpose and may simply serve as an indication of the use of the trimming method as described herein. The use of the additional elongated structure 353 in this trimming method may be advantageous in terms of completing printing along the straight edge of the support structurer 302.

Figure 6F:
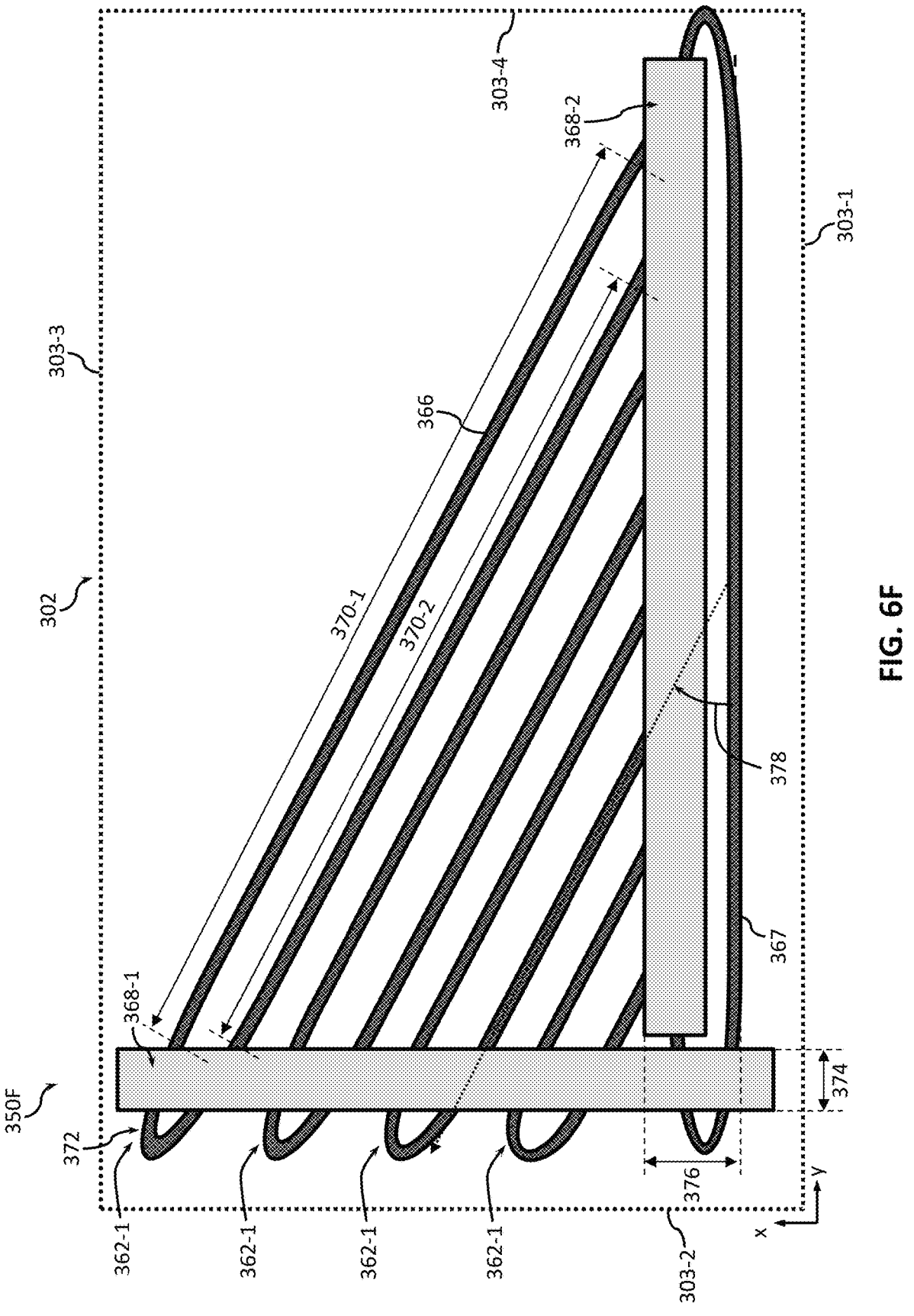

Having the loops at the first ends 362-1 of the angled elongated semiconductor structures 366 and having the additional elongated semiconductor structures 367 and 369 materially continuous at the other ends of the angled elongated semiconductor structures 366 may not be desirable for forming active devices (e.g., transistors) along the angled elongated semiconductor structures 366. Therefore, FIG. 6F illustrates an IC device 350F which is substantially the same as the IC device 350E (although not all reference numerals shown in FIGS. 6A-6H are repeated again in FIG. 6F, in order to not clutter the drawing), showing that the method may then proceed with providing a first cut line 368-1 and a second cut line 368-2. The first cut line 368-1 may electrically isolate the loops of the angled elongated semiconductor structures 366 at the first ends 362-1 from the straight portions of the angled elongated semiconductor structures 366. The second cut line 368-2 may electrically isolate the additional elongated semiconductor structures 367 and 369 from the straight portions of the angled elongated semiconductor structures 366. In this manner, substantially straight portions 370 of the angled elongated semiconductor structures 366 may be left in between the first cut line 368-1 and the second cut line 368-2. In FIG. 6F, only two of such substantially straight portions 370 are labeled as portions 370-1 and 370-2, for one of the loops of the angled elongated semiconductor structures 366, but a plurality of such portions 370 are shown.

In some embodiments, the first cut line 368-1 may be substantially parallel to the edges 303-2 and 303-4 and substantially perpendicular to the edges 303-1 and 303-3. Similarly, in some embodiments, the second cut line 368-2 may be substantially parallel to the edges 303-1 and 303-3 and substantially perpendicular to the edges 303-2 and 303-4. The cut lines 368 may be filled with any suitable insulator material to provide the electrical isolation as described herein.

As a result of using the first cut line 368-1, a plurality of the U-shaped loop portions 372 of the semiconductor material that is substantially the same as that of the substantially straight portions 370 of the angled elongated semiconductor structures 366 at the first ends 362-1 would be detectable in the final IC structures as U-shaped portions of semiconductor materials not electrically connected to anything, just remaining in the final device as consequences of using the trim patterning method as described herein. Similarly, as a result of using the second cut line 368-2, the additional elongated semiconductor structure 367 proximate to the opposite ends of the substantially straight portions 370 of the angled elongated semiconductor structures 366 would also be detectable in the final IC structures as a substantially straight portion of semiconductor materials not electrically connected to anything. In some embodiments, the U-shaped portions 372 and the additional elongated semiconductor structure 367 may be enclosed by an insulator material on all sides. As a result of the patterning of FIGS. 6A-6H, if the substantially straight portions 370 of the angled elongated semiconductor structures 366 are fins extending away from the support structure 302, then the U-shaped portions 372 and the additional elongated semiconductor structure 367 would also be extending away from the support structure 302 in a similar manner, and to the same height. On the other hand, if the substantially straight portions 370 of the angled elongated semiconductor structures 366 are nanoribbons provided over the support structure 302, then the U-shaped portions 372 and the additional elongated semiconductor structure 367 would be in the same layer as the nanoribbons, also provided over the support structure 302 in a similar manner, possibly with the same insulator material between them and the support structure 302 as for the nanoribbons.

In some embodiments, in a direction of the longitudinal axes of the angled elongated semiconductor structures 366 (such as the longitudinal axes 320, described above), a dimension of the U-shaped loop portions 372 at the first ends 362-1 would be, at most, 10% of the length of the substantially straight portions 370 of the angled elongated semiconductor structures 366. Projections of the U-shaped loop portions of the semiconductor material onto the support structure 302 may be curves, which would be very distinct from the analogous projections of the substantially straight portions 370 of the angled elongated semiconductor structures 366, which would not be curves. Projection of the additional elongated semiconductor structure 367 onto the support structure 302 would also be very distinct from the analogous projections of the substantially straight portions 370 of the angled elongated semiconductor structures 366 because the former would be substantially parallel to the edge 303-1, whereas the latter would be at an acute angle from the edge 303-1.

In some embodiments, a width 374 of the first cut line 368-1 may be between about 3 nanometers and 1000 nanometers, e.g., between about 5 nanometers and 100 nanometers, or between about 10 nanometers and 75 nanometers. The second cut line 368-2 may have a similar width. In some embodiments, a distance of the additional elongated semiconductor structure 367 from the nearest ends of the substantially straight portions 370 of the angled elongated semiconductor structures 366, labeled in FIG. 6F as a distance 376, could be between about 5 nanometers and 1500 nanometers, e.g., between about 10 nanometers and 500 nanometers, or between about 20 nanometers and 250 nanometers.

In some embodiments, an angle between the additional elongated semiconductor structure 367 and each of the angled elongated semiconductor structures 366, or an angle between respective projections of these structures onto the support structure 302, shown in FIG. 6F as an angle 378, may be between about 10 and 60 degrees, e.g., between about 10 and 45 degrees or between about 10 and 30 degrees. In some embodiments, an angle between the additional elongated semiconductor structure 367 (or a projection thereof onto the support structure 302) and the edge 303-1, shown in FIG. 6F as an angle 380, may be less than about 15, e.g., less than about 10 degrees or less than about 5 degrees. The angle between the substantially straight portions 370 of the angled elongated semiconductor structures 366 may be substantially the same as the angle 323, defined above. During operation of the IC device 350, the additional elongated semiconductor structure 367 may remain electrically floating (i.e., not be connected to any voltage or current sources).

In the trim patterning method as described above, the backbone material 354 may include any material that is sufficiently etch-selective with respect to the liner 360, e.g., any of the isolator materials described herein. The liner 360 may be any material that can serve as an etch mask for etching the semiconductor material of the support structure 302 underneath, i.e., the liner 360 may include any material that is sufficiently etch-selective with respect to the semiconductor material of the support structure 302, e.g., a material that includes silicon and nitrogen (e.g., silicon nitride), or any other suitable material. Further variations to the trim patterning method described above are possible and are illustrated in FIGS. 6G and 6H. In the embodiments of these variations, the backbone material 354 and the liner 360 may be chosen differently than described above, depending on which variation of the trim patterning method is implemented, which will now be described.

Figure 6G:
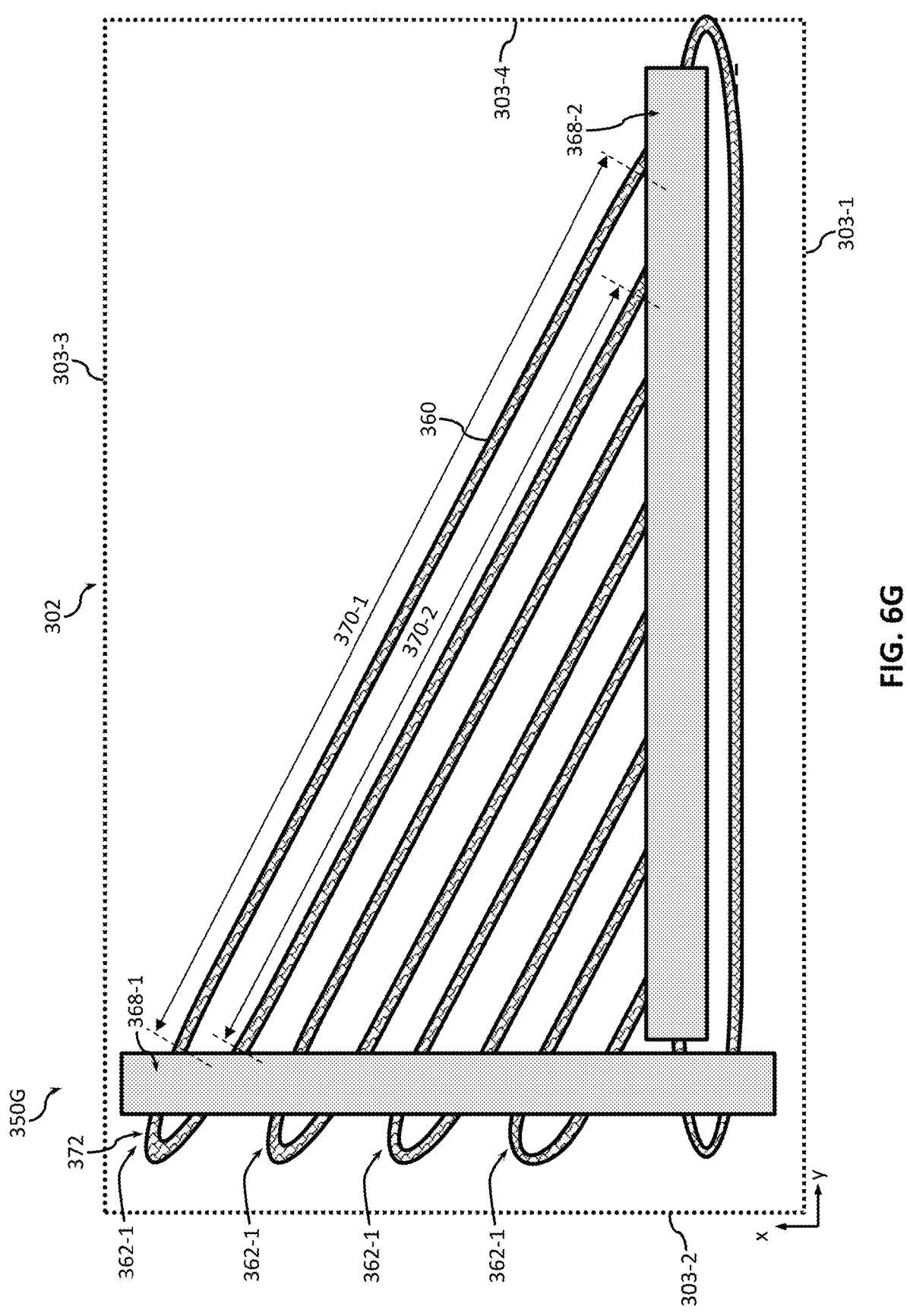

FIG. 6G illustrates an IC device 350G that is substantially the same as the IC device 350D, shown in FIG. 6D, except that it is processed further to form the cut lines 368-1 and 368-2 as described with reference to FIG. 6F. Such an embodiment may be used if the liner 360 is already the semiconductor material based on which angled transistors may be formed. In such an embodiment, the liner 360 may include any suitable semiconductor material, such as those described with reference to the channel materials of the transistors 110 and 210, as long as it can be deposited as a liner. For example, the liner 360 may include any semiconductor material that may be used in a TFT, such as any of polycrystalline, polymorphous, or amorphous semiconductors described above. In another example of FIG. 6G, the liner 360 may include any 2D semiconductor material, such as any of graphene, hexagonal boron nitride, or transition-metal chalcogenides, described above. Because the backbone material 354 is removed in the embodiment of FIG. 6G, the backbone material 354 may be selected as any material that is sufficiently etch-selective with respect to the liner 360.

Figure 6H:
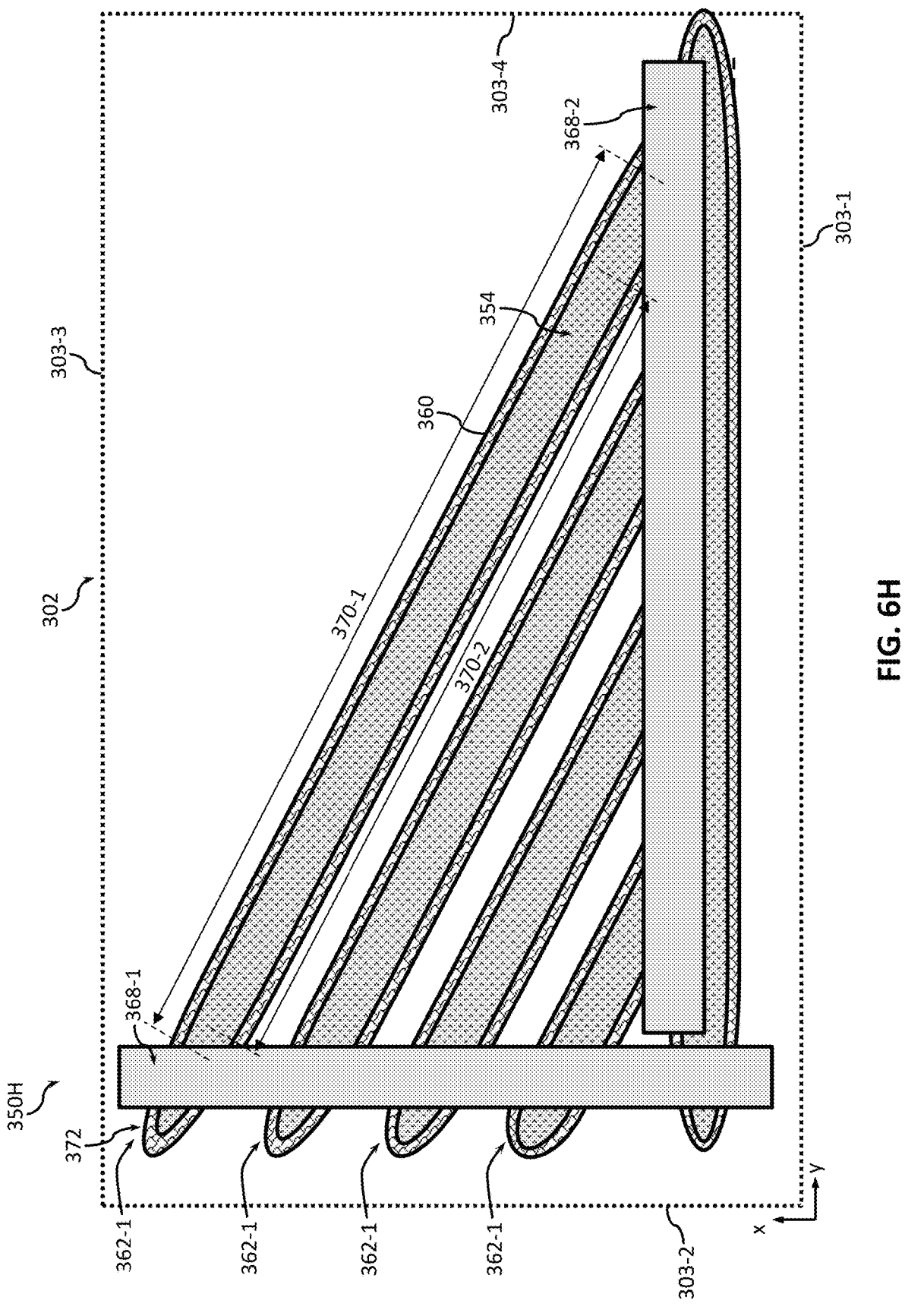

FIG. 6H illustrates an IC device 350H that is substantially the same as the IC device 350C, shown in FIG. 6C, except that it is processed further to form the cut lines 368-1 and 368-2 as described with reference to FIG. 6F. Phrased differently, the IC device 350H is substantially the same as the IC device 350G, shown in FIG. 6G, except that the backbone material 354 is not removed. Similar to FIG. 6G, the embodiment of FIG. 6H may be used if the liner 360 is already the semiconductor material based on which angled transistors may be formed, as described with reference to FIG. 6G. In contrast to the embodiment of FIG. 6G, because the backbone material 354 is not removed in the embodiment of FIG. 6H, the backbone material 354 does not need to, although it may, be selected as a material that is sufficiently etch-selective with respect to the liner 360, but the backbone material 354 does need to provide electrical insulation between individual instances of the substantially straight portions 370 of the angled elongated semiconductor structures of the liner 360. Therefore, in the embodiment of FIG. 6H, the backbone material 354 may include any suitable isolator material.

Although not specifically shown, the trim patterning method as illustrated in FIGS. 6A-6H may further include other manufacturing operations related to fabrication of other components of an angled transistor. For example, the trim patterning method as illustrated in FIGS. 6A-6H may further include patterning the angled elongated structures of the semiconductor materials (e.g., either the angled elongated semiconductor structures 366 if the version of FIG. 6F is implemented or the semiconductor material of the liner 360 if the version of FIG. 6G or FIG. 6H is implemented). In another example, the trim patterning method as illustrated in FIGS. 6A-6H may further include forming angled transistors (e.g., transistors 110 and/or transistors 210 as described above) based on the angled elongated structures of the semiconductor materials (e.g., either the angled elongated semiconductor structures 366 if the version of FIG. 6F is implemented or the semiconductor material of the liner 360 if the version of FIG. 6G or FIG. 6H is implemented), as well as integrating at least some of such angled transistors with non-angled transistors (e.g., as described with reference to FIGS. 5A-5Q).

Figure 7A:
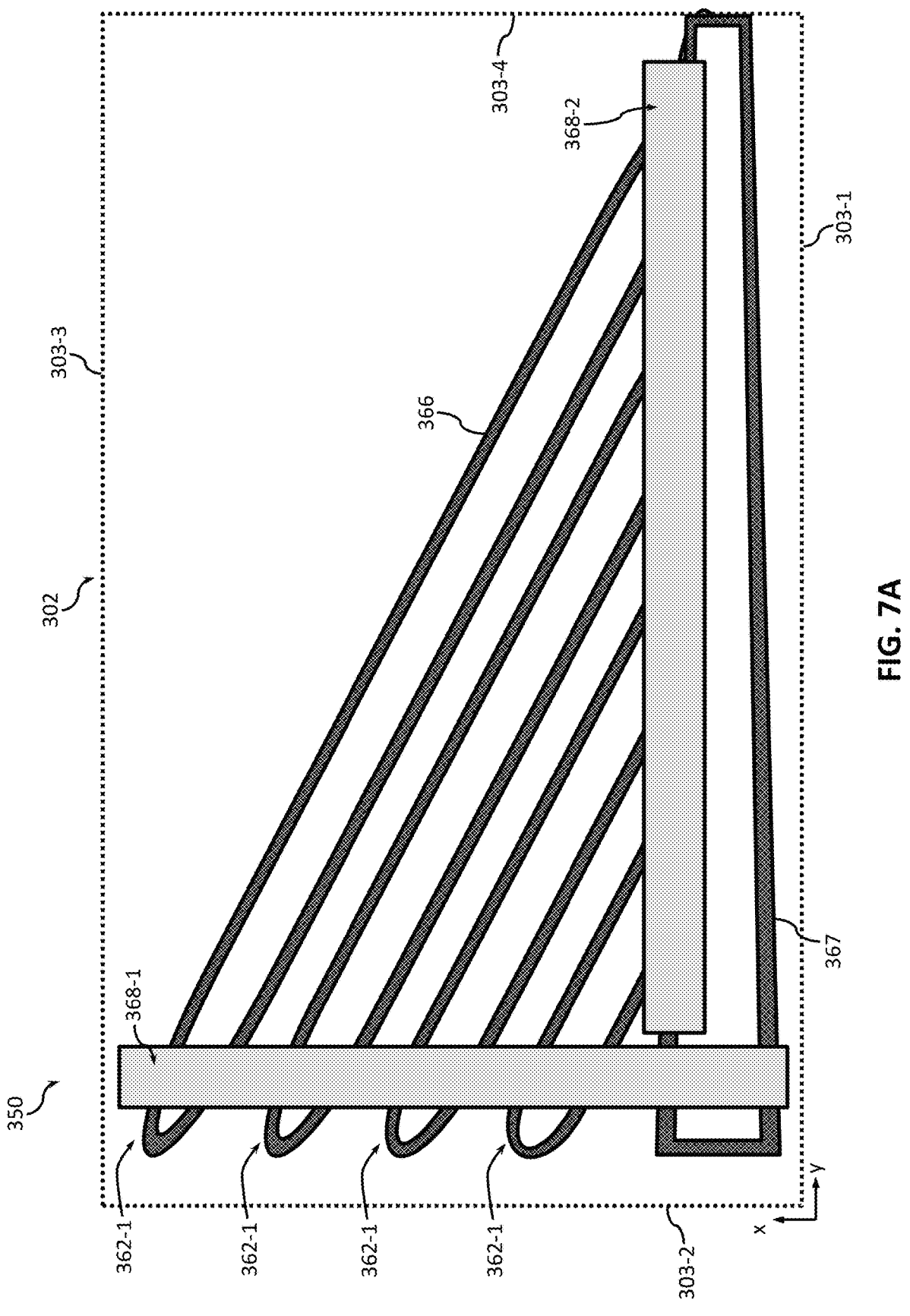
FIGS. 7A-7B provide top-down views of alternative arrangements of various components of the IC device that may be manufactured using the method shown in FIGS. 6A-6H, in accordance with some embodiments.
Figure 7B:
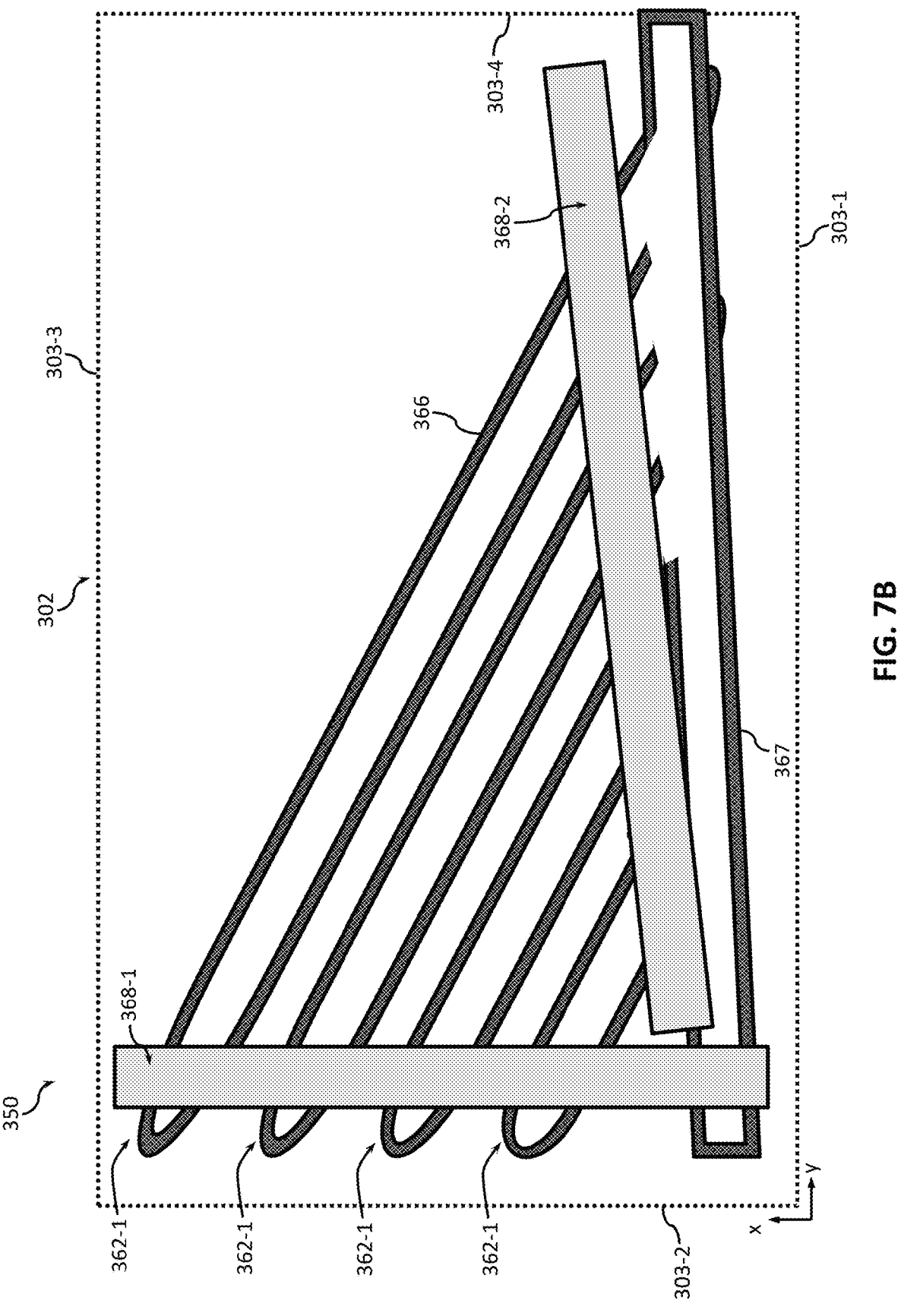

The trim patterning method described above is not limited to arrangements of various components of the IC devices 350 as shown in FIGS. 6A-6H. Some alternative arrangements of various components of the IC device that may be manufactured using the method shown in FIGS. 6A-6H are shown in FIGS. 7A-7B. Each of FIGS. 7A-7B illustrate an IC device 350 that is similar to the embodiment shown in FIG. 6F but having some differences in arrangement. Therefore, the same or analogous reference numerals as those used in FIG. 6F are used in FIGS. 7A-7B to refer to similar or analogous components, so that only the differences of FIGS. 7A-7B with respect to FIG. 6F are described. Thus, besides the differences of the arrangement of FIGS. 7A-7B, all of the descriptions provided for the trim patterning method of FIGS. 6A-6H are applicable to the IC devices 350 shown in FIGS. 7A-7B. In particular, even though not specifically shown, any of the arrangements of FIGS. 7A-7B may be alternatively implemented according to the embodiments of FIG. 6G or FIG. 6H instead. In other words, analogous modifications may be applied to the re-arrange the individual components of the embodiments of FIG. 6G or FIG. 6H to arrive as the arrangements of FIGS. 7A-7B as those described with re-arranging the individual components of the embodiment of FIG. 6F, all of which embodiments being within the scope of the present disclosure.

The embodiment of FIG. 6F was realized based on the additional elongated structure 353 being a rectangle with rounded corners and, as a result, the additional elongated semiconductor structures 367 and 369 were substantially parallel to one another. That does not have to be the case in other embodiments. One example is illustrated in FIG. 7A, showing that the additional elongated semiconductor structure 367 is formed based on the additional elongated structure 353 being a trapezoid. Another example is illustrated in FIG. 7B, showing that the additional elongated semiconductor structure 367 is formed based on the additional elongated structure 353 being a parallelogram. FIG. 7B further illustrates that the second cut line 368-2 does not have to be parallel to the edge 303-1. The same may apply to the first cut line 368-1, not specifically shown in the present drawings.

Any of the angled transistors described herein (e.g., as described with reference to FIGS. 1, 2, and 4), as well as any of the non-angled transistors that may be integrated on the same support structure with the angled transistors (e.g., as described with reference to FIG. 5) may be used to implement any suitable components. For example, in various embodiments, transistors described herein may be part of one or more of: a central processing unit, a memory device (e.g., a high-bandwidth memory device), a memory cell, a logic circuit, input/output circuitry, a field programmable gate array (FPGA) component such as an FPGA transceiver or an FPGA logic, a power delivery circuitry, an amplifier (e.g., a III-V amplifier), Peripheral Component Interconnect Express (PCIE) circuitry, Double Data Rate (DDR) transfer circuitry, a computing device (e.g., a wearable or a handheld computing device), etc.

The IC devices with angled transistors disclosed herein may be included in any suitable electronic device. FIGS. 8-12 illustrate various examples of apparatuses that may include one or more of the IC devices with angled transistors disclosed herein.

Figure 8:
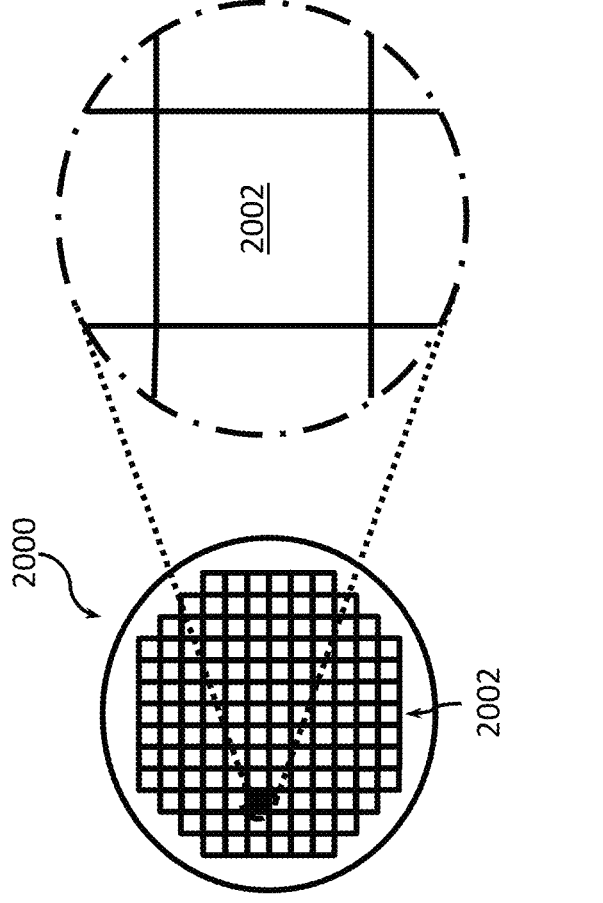
FIG. 8 provides top views of a wafer and dies that may include one or more IC devices with angled transistors in accordance with any of the embodiments disclosed herein.

FIG. 8 illustrates top views of a wafer 2000 and dies 2002 that may include one or more IC devices with angled transistors in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 9. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more IC devices with angled transistors as described herein). After the fabrication of the semiconductor product is complete (e.g., after manufacture of any embodiment of the IC devices with angled transistors as described herein), the wafer 2000 may undergo a singulation process in which each of the dies 2002 is separated from one another to provide discrete "chips" of the semiconductor product. In particular, devices that include one or more angled transistors as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a hysteretic memory device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 11) or other logic that is configured to store information in the memory devices or execute instructions stored in the memory array.

Figure 9:
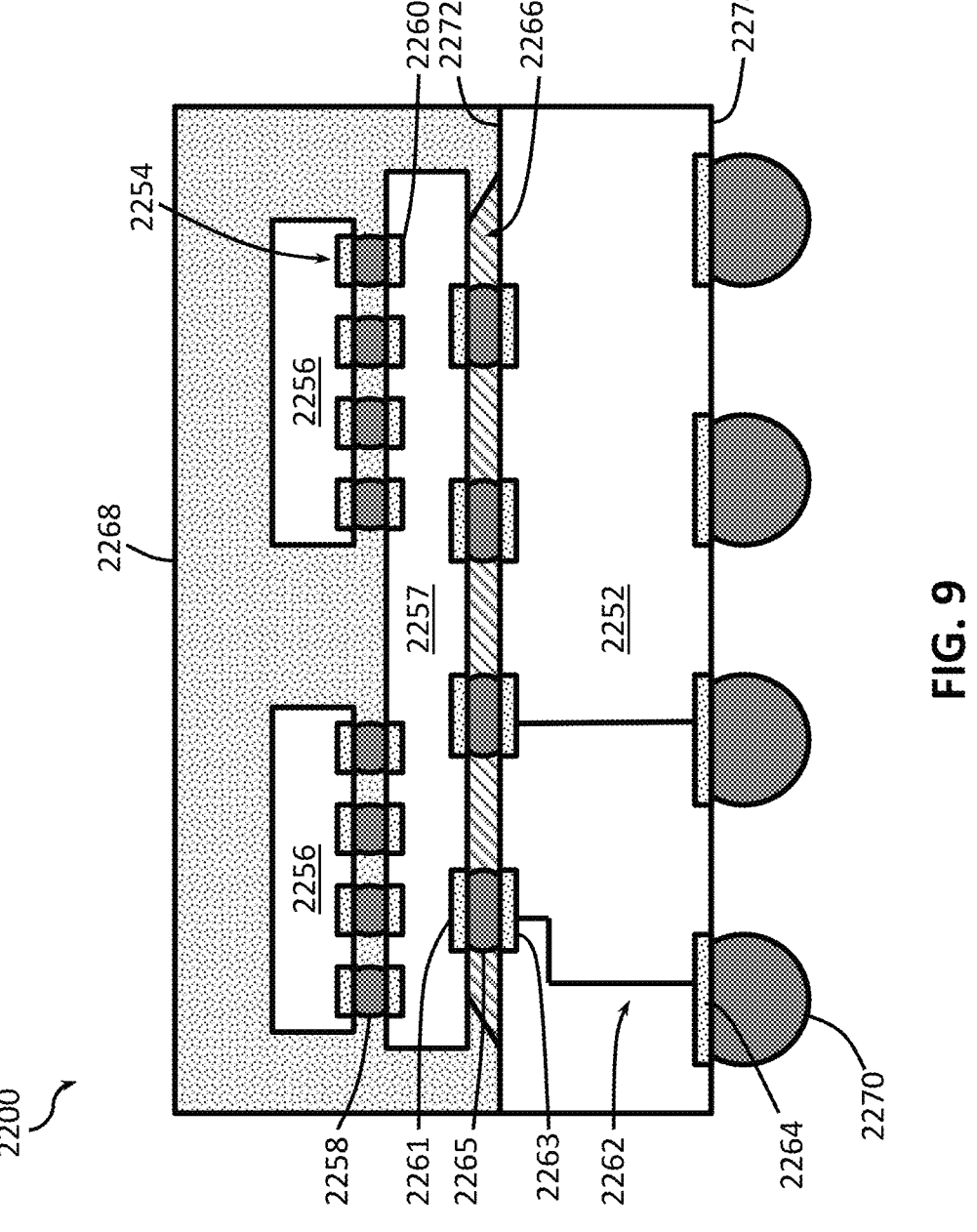
FIG. 9 is a cross-sectional side view of an IC package that includes an IC device with angled transistors in accordance with any of the embodiments disclosed herein.

FIG. 9 is a side, cross-sectional view of an example IC package 2200 that may include one or more IC devices with angled transistors in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 9 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 9 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 9 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 10.

The dies 2256 may take the form of any of the embodiments of the die 2002 discussed herein (e.g., may include any of the embodiments of the IC devices with angled transistors as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high-bandwidth memory), including embedded memory dies as described herein. In some embodiments, any of the dies 2256 may include one or more IC devices with angled transistors, e.g., as discussed above; in some embodiments, at least some of the dies 2256 may not include any IC devices with angled transistors.

The IC package 2200 illustrated in FIG. 9 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 9, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 10:
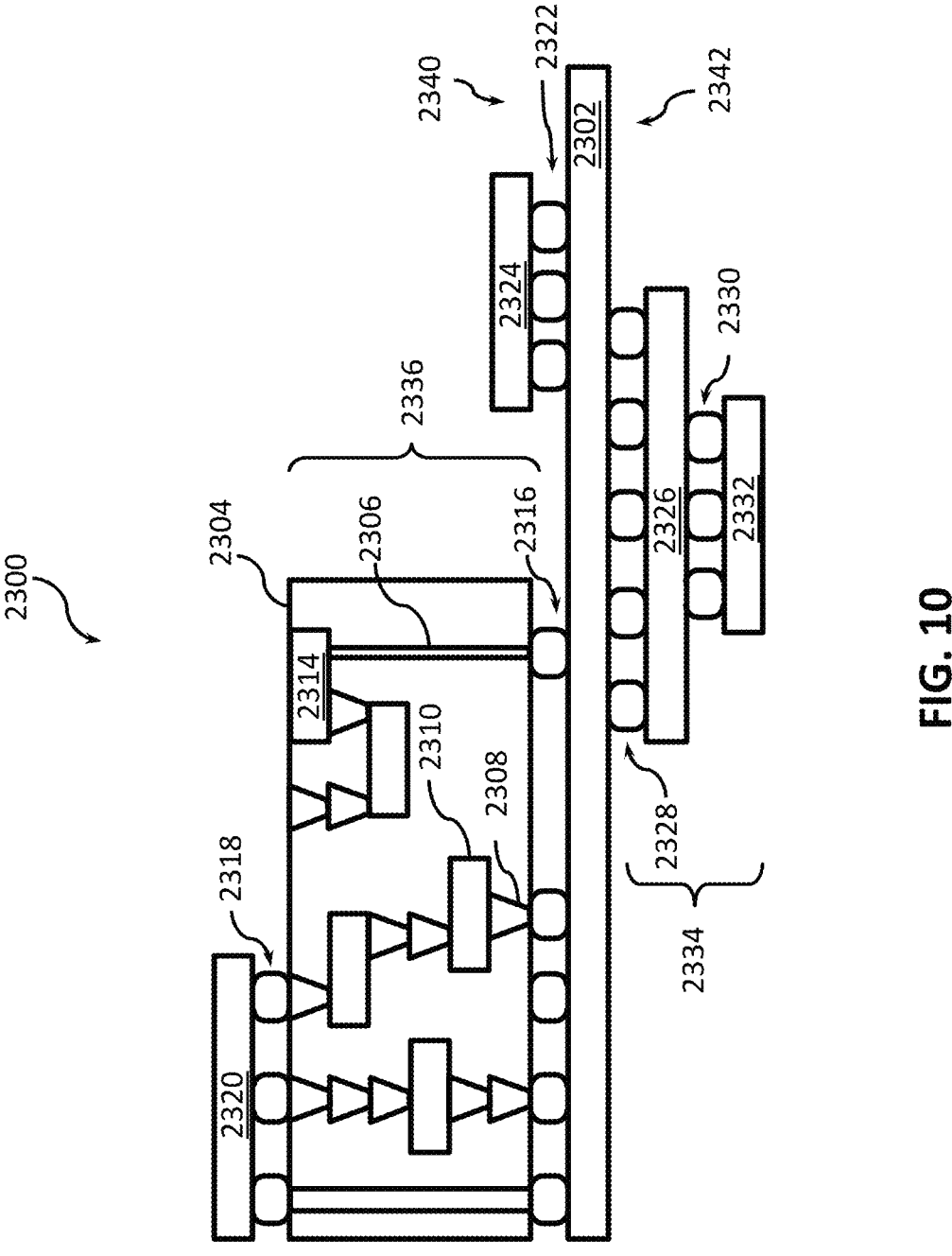
FIG. 10 is a cross-sectional side view of an IC device assembly that includes an IC device with angled transistors in accordance with any of the embodiments disclosed herein.

FIG. 10 is a cross-sectional side view of an IC device assembly 2300 that may include components having one or more IC devices with angled transistors in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices with angled transistors in accordance with any of the embodiments disclosed herein; e.g., any of the IC packages discussed below with reference to the IC device assembly 2300 may take the form of any of the embodiments of the IC package 2200 discussed above with reference to FIG. 9 (e.g., may include one or more IC devices with angled transistors provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 10 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 10), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 8), an IC device, or any other suitable component. In particular, the IC package 2320 may include one or more IC devices with angled transistors as described herein. Although a single IC package 2320 is shown in FIG. 10, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 10, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 10 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 11:
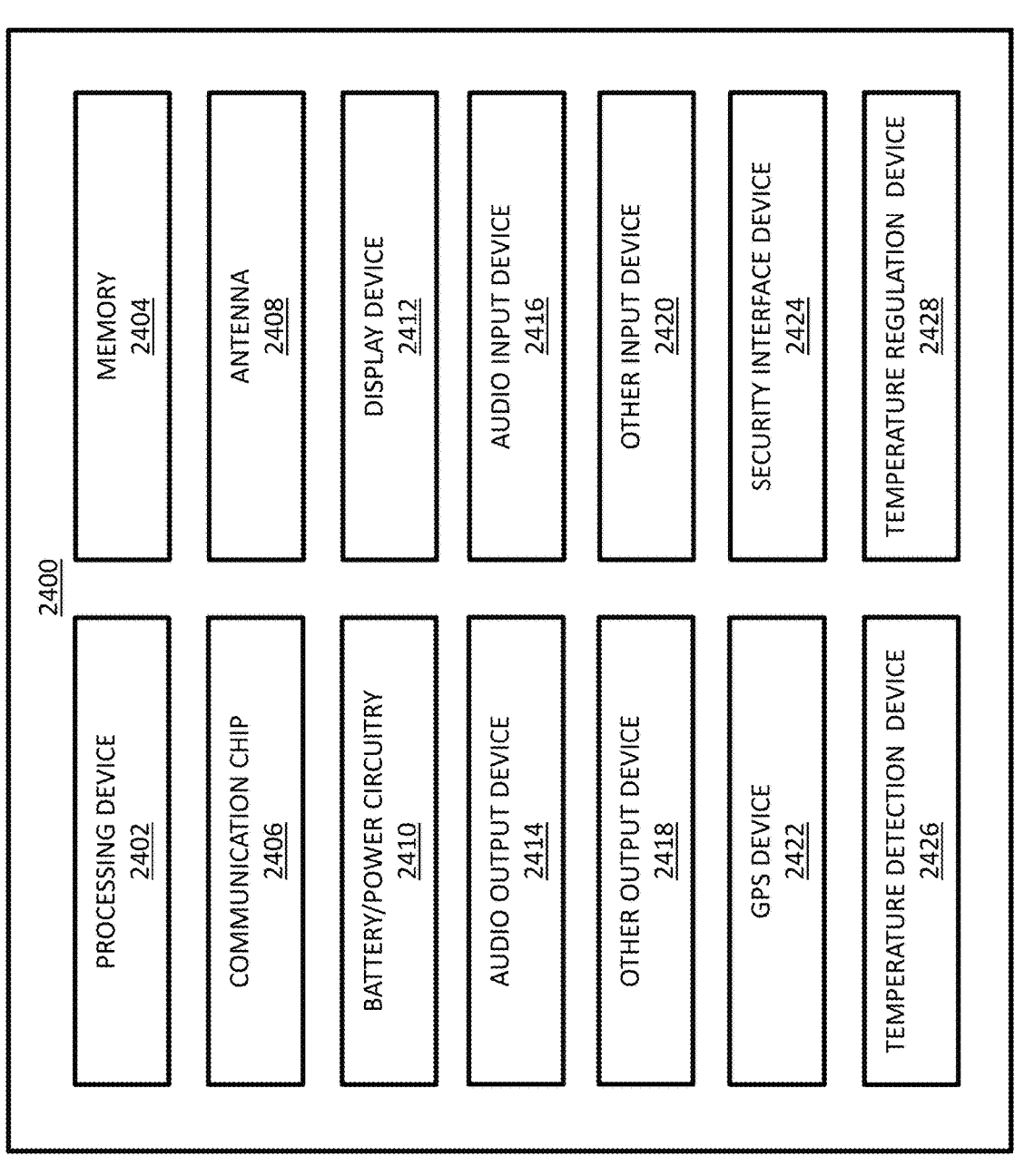
FIG. 11 is a block diagram of an example computing device that includes an IC device with angled transistors in accordance with any of the embodiments disclosed herein.

FIG. 11 is a block diagram of an example computing device 2400 that may include one or more components including one or more IC devices with angled transistors in accordance with any of the embodiments disclosed herein. For example, any suitable ones of the components of the computing device 2400 may include a die (e.g., the die 2002 of FIG. 8) having one or more angled transistors as described herein. Any one or more of the components of the computing device 2400 may include, or be included in, an IC package 2200 of FIG. 9 or an IC device 2300 of FIG. 10.

A number of components are illustrated in FIG. 11 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 11, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque MRAM.

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna 2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling device may have different locations within and around the computing device 2400. A cooling device of the temperature regulation device 2428 may be associated with one or more temperature sensors of the temperature detection device 2426 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related condition associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as a water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the computing efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy correlates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 12:
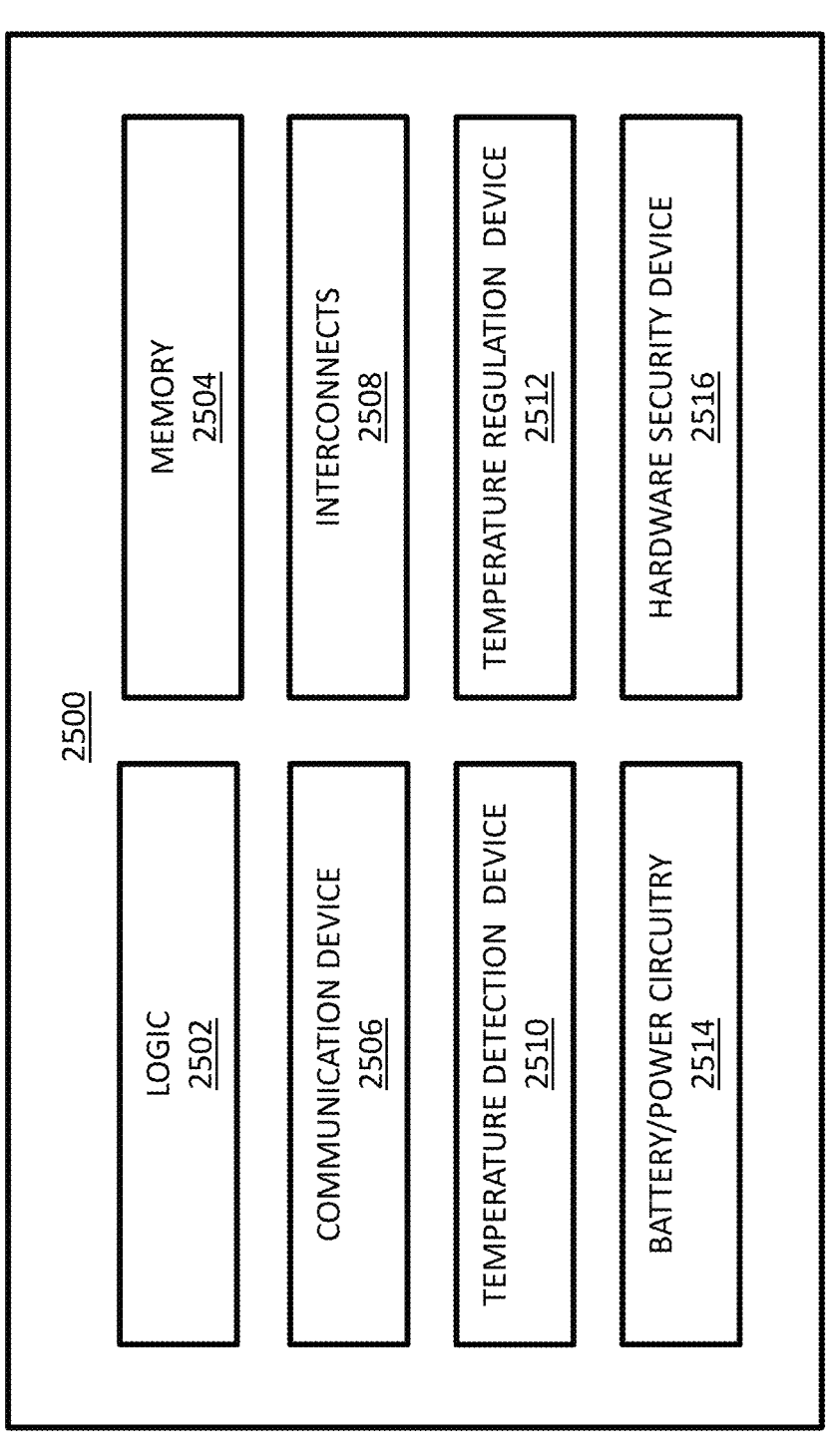
FIG. 12 is a block diagram of an example processing device that includes an IC device with angled transistors in accordance with any of the embodiments disclosed herein.

FIG. 12 is a block diagram of an example processing device 2500 that may include one or more IC devices with angled transistors in accordance with any of the embodiments disclosed herein. For example, any suitable ones of the components of the processing device 2500 may include a die (e.g., the die 2002 of FIG. 8) having one or more angled transistors as described herein. Any one or more of the components of the processing device 2500 may include, or be included in, an IC device 2300 (FIG. 10). Any one or more of the components of the processing device 2500 may include, or be included in, an IC package 2200 of FIG. 9 or an IC device 2300 of FIG. 10. Any one or more of the components of the processing device 2500 may include, or be included in, a computing device 2400 of FIG. 11; for example, the processing device 2500 may be the processing device 2402 of the computing device 2400.

A number of components are illustrated in FIG. 12 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 12, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configure to implement memory circuitry (e.g., ICs implementing one or more of memory devices, memory arrays, control logic configured to control the memory devices and arrays, etc.). In some embodiments, the memory 2504 may be implemented substantially as described above with reference to the memory 2404 (FIG. 11). In some embodiments, the memory 2504 may be a designated device configured to provide storage functionality for the components of the processing device 2500 (i.e., local), while the memory 1604 may be configured to provide system-level storage functionality for the entire computing device 2400 (i.e., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layer or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, i.e., the size and capabilities of each component. With hierarchical memory, each of the various memory components can be viewed as part of a hierarchy of memories ($m_1$, $m_2$, . . . , $m_n$) in which each member m, is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 2406 (FIG. 11). In some embodiments, the communication device 2506 may be a designated device configured to provide communication functionality for the components of the processing device 2500 (i.e., local), while the communication chip 2406 may be configured to provide system-level communication functionality for the entire computing device 2400 (i.e., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 2500 may include a temperature detection device 2510 which may be implemented substantially as described above with reference to the temperature detection device 2426 of FIG. 11 but configured to determine temperatures on a more local scale, i.e., of the processing device 2500 of components thereof. In some embodiments, the temperature detection device 2510 may be a designated device configured to provide temperature detection functionality for the components of the processing device 2500 (i.e., local), while the temperature detection device 2426 may be configured to provide system-level temperature detection functionality for the entire computing device 2400 (i.e., global).

The processing device 2500 may include a temperature regulation device 2512 which may be implemented substantially as described above with reference to the temperature regulation device 2428 of FIG. 11 but configured to regulate temperatures on a more local scale, i.e., of the processing device 2500 of components thereof. In some embodiments, the temperature regulation device 2512 may be a designated device configured to provide temperature regulation functionality for the components of the processing device 2500 (i.e., local), while the temperature regulation device 2428 may be configured to provide system-level temperature regulation functionality for the entire computing device 2400 (i.e., global).

The processing device 2500 may include a battery/power circuitry 2514 which may be implemented substantially as described above with reference to the battery/power circuitry 2410 of FIG. 11. In some embodiments, the battery/power circuitry 2514 may be a designated device configured to provide battery/power functionality for the components of the processing device 2500 (i.e., local), while the battery/power circuitry 2410 may be configured to provide system-level battery/power functionality for the entire computing device 2400 (i.e., global).

The processing device 2500 may include a hardware security device 2516 which may be implemented substantially as described above with reference to the security interface device 2424 of FIG. 11. In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessors chips.

The above description of illustrated implementations of the disclosure, including what is described in the Abstract, is not intended to be exhaustive or to limit the disclosure to the precise forms disclosed. Unless specified otherwise, in various embodiments, features described with respect to one of the drawings may be combined with those described with respect to other drawings.

The following paragraphs provide various examples of the embodiments disclosed herein.

Example 1 provides an IC device that includes a support structure (e.g., a die, a substrate, a carrier substrate, etc.); an elongated structure (e.g., a fin or a nanoribbon) of a semiconductor material provided over the support structure; a first further structure of the semiconductor material (i.e., the same material as the elongated structure), proximate to a first end of the elongated structure; and a second further structure of the semiconductor material (i.e., the same material as the elongated structure), proximate to a second end of the elongated structure (the second end being opposite the first end), where a projection of the elongated structure on the support structure is along a first longitudinal axis, a projection of the first further structure on the support structure is a curve, and a projection of the second further structure on the support structure is along a second longitudinal axis at an angle between 10 and 80 degrees to the first longitudinal axis.

Example 2 provides the IC device according to example 1, where the projection of the first further structure on the support structure has a U-shape.

Example 3 provides the IC device according to any one of examples 1-2, where the projection of the elongated structure on the support structure has a first dimension in a first direction and a second dimension in a second direction, the first direction is perpendicular to the second direction, the first dimension greater than the second dimension, and the curve has a portion extending along the first direction.

Example 4 provides the IC device according to example 3, where a line along the first direction in the projection of the elongated structure on the support structure overlaps with a line along the first direction in the portion of the curve.

Example 5 provides the IC device according to any one of examples 3-4, where the first direction is at an angle between 10 degrees and 80 degrees with respect to an edge of the support structure (the edge of the support structure may be, e.g., an edge of one of the two opposing faces of the support structure).

Example 6 provides the IC device according to any one of examples 3-5, where a dimension of the portion of the curve extending along the first direction is less than 10% of the first dimension of the projection of the elongated structure on the support structure.

Example 7 provides the IC device according to any one of examples 1-6, where a distance between the elongated structure and the first further structure is between about 3 nanometers and 1000 nanometers, e.g., between about 5 nanometers and 100 nanometers, or between about 10 nanometers and 75 nanometers.

Example 8 provides the IC device according to any one of examples 1-7, where the elongated structure is a first fin extending away from the support structure, the first further structure is a curved structure extending away from the support structure, and the second further structure is a second fin extending away from the support structure.

Example 9 provides the IC device according to example 8, where a height of the first fin and/or a height of the second fin is substantially equal to a height of the curved structure.

Example 10 provides the IC device according to any one of examples 1-7, where the elongated structure is a first nanoribbon extending parallel to the support structure, the first further structure is a curved structure extending parallel to the support structure, and the second further structure is a second nanoribbon extending parallel to the support structure.

Example 11 provides the IC device according to example 10, further including an insulator material between the first nanoribbon and/or the second nanoribbon and the support structure and between the curved structure and the support structure.

Example 12 provides the IC device according to any one of examples 1-11, where a distance from the support structure to a surface of the elongated structure that is farthest away from the support structure is substantially equal to a distance from the support structure to a surface of the first further structure that is farthest away from the support structure.

Example 13 provides the IC device according to any one of examples 1-12, further including an insulator material between the elongated structure and the first further structure and/or between the elongated structure and the second further structure.

Example 14 provides the IC device according to any one of examples 1-13, where the first further structure electrically disconnected from all other elements or components of the IC device.

Example 15 provides the IC device according to any one of examples 1-14, where the second further structure electrically disconnected from all other elements or components of the IC device.

Example 16 provides the IC device according to any one of examples 1-15, where the first further structure is enclosed by an insulator material on all sides (i.e., the first further structure is not electrically connected to anything in the IC device).

Example 17 provides the IC device according to any one of examples 1-16, where the second further structure is enclosed by an insulator material on all sides (i.e., the second further structure is not electrically connected to anything in the IC device).

Example 18 provides an IC device that includes a support structure (e.g., a die, a substrate, a carrier substrate, etc.); a first elongated structure of a semiconductor material provided over the support structure; and a second elongated structure of the semiconductor material (i.e., the same material as the first elongated structure), proximate to an end of the first elongated structure and at an angle between about 10 and 60 degrees with respect to the first elongated structure.

Example 19 provides the IC device according to example 18, where an angle between a projection of the first elongated structure on the support structure and an edge of the support structure is between about 5 and 45 degrees.

Example 20 provides the IC device according to example 19, where an angle between a projection of the second elongated structure on the support structure and the edge of the support structure is less than about 15 degrees.

Example 21 provides the IC device according to any one of examples 18-20, where the first elongated structure and the second elongated structure are electrically isolated from one another.

Example 22 provides the IC device according to any one of examples 18-21, where the first elongated structure includes one or more transistors, and the second elongated structure is electrically disconnected from all elements or components of the IC device.

Example 23 provides the IC device according to any one of examples 18-22, where the second elongated structure is electrically floating during operation of the IC device.

Example 24 provides the IC device according to any one of examples 18-23, where a distance between the first elongated structure and the second elongated structure is less than about 250 nanometers.

Example 25 provides the IC device according to any one of examples 18-24, where the first elongated structure and the second elongated structure are fins or nanoribbons.

Example 26 provides an IC device that includes a support structure (e.g., a die, a substrate, a carrier substrate, etc.); a first fin provided over the support structure; and a second fin provided over the support structure, where an angle between a projection of the first fin on the support structure and an edge of the support structure is between about 5 and 45 degrees and an angle between a projection of the second fin on the support structure and the edge of the support structure is less than about 15 degrees.

Example 27 provides the IC device according to example 26, where the first fin and the second fin are electrically isolated from one another.

Example 28 provides the IC device according to any one of examples 26-27, where the first fin includes one or more transistors, and the second fin is electrically disconnected from all elements or components of the IC device.

Example 29 provides the IC device according to any one of examples 26-28, where the second fin is electrically floating during operation of the IC device.

Example 30 provides the IC device according to any one of examples 26-29, where a distance between the first fin and the second fin is less than about 250 nanometers.

Example 31 provides the IC device according to any one of examples 1-30, where the IC device includes or is a part of a central processing unit.

Example 32 provides the IC device according to any one of examples 1-31, where the IC device includes or is a part of a memory device, e.g., a high-bandwidth memory device.

Example 33 provides the IC device according to any one of examples 1-32, where the IC device further includes a plurality of memory cells, each of the memory cells including a storage element.

Example 34 provides the IC device according to example 33, where the storage element is one of a capacitor, a magnetoresistive material, a ferroelectric material, or a resistance-changing material.

Example 35 provides the IC device according to any one of examples 1-34, where the IC device includes or is a part of a logic circuit.

Example 36 provides the IC device according to any one of examples 1-35, where the IC device includes or is a part of input/output circuitry.

Example 37 provides the IC device according to any one of examples 1-36, where the IC device includes or is a part of a field programmable gate array transceiver.

Example 38 provides the IC device according to any one of examples 1-37, where the IC device includes or is a part of a field programmable gate array logic.

Example 39 provides the IC device according to any one of examples 1-38, where the IC device includes or is a part of a power delivery circuitry.

Example 40 provides the IC device according to any one of examples 1-39, where the IC device includes or is a part of a III-V amplifier.

Example 41 provides the IC device according to any one of examples 1-40, where the IC device includes or is a part of Peripheral Component Interconnect Express circuitry or Double Data Rate transfer circuitry.

Example 42 provides an IC package that includes an IC device according to any one of examples 1-41; and a further IC component, coupled to the IC die.

Example 43 provides the IC package according to example 42, where the further IC component includes one of a package substrate, an interposer, or a further IC die.

Example 44 provides a computing device that includes a carrier substrate and an IC device, coupled to the carrier substrate, where the IC device is an IC device according to any one of examples 1-41, or the IC device is included in the IC package according to any one of examples 42-43.

Example 45 provides the computing device according to example 44, where the computing device is a wearable or handheld computing device.

Example 46 provides the computing device according to examples 44 or 45, where the computing device further includes one or more communication chips and an antenna.

Example 47 provides the computing device according to any one of examples 44-46, where the carrier substrate is a motherboard.

Example 48 provides a method of manufacturing an IC device, the method including providing the IC device according to any one of the preceding examples.

The invention claimed is:

1. An integrated circuit (IC) device, comprising:
a substrate;
an elongated structure of a semiconductor material over the substrate;
a first structure of the semiconductor material, proximate to a first end of the elongated structure; and
a second structure of the semiconductor material, proximate to a second end of the elongated structure,
wherein:
a projection of the elongated structure on the substrate is along a first longitudinal axis,
a projection of the first structure on the substrate is a curve, and
a projection of the second structure on the substrate is along a second longitudinal axis at an angle between 10 and 80 degrees to the first longitudinal axis.

2. The IC device according to claim 1, wherein the projection of the first structure on the substrate has a U-shape.

3. The IC device according to claim 1, wherein:
the projection of the elongated structure on the substrate has a first dimension in a first direction and a second dimension in a second direction,
the first direction is perpendicular to the second direction,
the first dimension greater than the second dimension, and
the curve has a portion extending along the first direction.

4. The IC device according to claim 3, wherein a line along the first direction in the projection of the elongated structure on the substrate overlaps with a line along the first direction in the portion of the curve.

5. The IC device according to claim 3, wherein the first direction is at an angle between 10 degrees and 80 degrees with respect to an edge of the substrate.

6. The IC device according to claim 3, wherein a dimension of the portion of the curve extending along the first direction is less than 10% of the first dimension of the projection of the elongated structure on the substrate.

7. The IC device according to claim 1, wherein a distance between the elongated structure and the first structure is between about 3 nanometers and 1000 nanometers.

8. The IC device according to claim 1, wherein:
the elongated structure is a first fin extending away from the substrate,
the first structure is a curved structure extending away from the substrate, and
the second structure is a second fin extending away from the substrate.

9. The IC device according to claim 8, wherein a height of the first fin or a height of the second fin is substantially equal to a height of the curved structure.

10. The IC device according to claim 1, wherein:
the elongated structure is a first nanoribbon extending parallel to the substrate,
the first structure is a curved structure extending parallel to the substrate, and
the second structure is a second nanoribbon extending parallel to the substrate.

11. The IC device according to claim 10, further comprising an insulator material between the first nanoribbon or the second nanoribbon and the substrate and between the curved structure and the substrate.

12. The IC device according to claim 1, wherein a distance from the substrate to a surface of the elongated structure that is farthest away from the substrate is substantially equal to a distance from the substrate to a surface of the first structure that is farthest away from the substrate.

13. The IC device according to claim 1, wherein the first structure is enclosed by an insulator material on all sides.

14. The IC device according to claim 1, wherein the second structure is enclosed by an insulator material on all sides.

15. An integrated circuit (IC) device, comprising:
a die;
a first elongated structure of a semiconductor material over the die; and
a second elongated structure of the semiconductor material over the die, proximate to an end of the first elongated structure and at an angle between about 10 and 60 degrees with respect to the first elongated structure,
wherein the first elongated structure and the second elongated structure are electrically isolated from one another, the first elongated structure includes one or more transistors, and the second elongated structure does not include any transistors.

16. The IC device according to claim 15, wherein an angle between a projection of the first elongated structure on the die and an edge of the die is between about 5 and 45 degrees.

17. The IC device according to claim 16, wherein an angle between a projection of the second elongated structure on the die and the edge of the die is less than about 15 degrees.

18. The IC device according to claim 15, wherein a distance between the first elongated structure and the second elongated structure is less than about 250 nanometers.

19. An integrated circuit (IC) device, comprising:
a support;
a first fin over the support; and
a second fin over the support,
wherein the first fin and the second fin are electrically isolated from one another, the first fin includes one or more transistors, the second fin does not include any transistors, an angle between a projection of the first fin on the support and an edge of the support is between about 5 and 45 degrees, and an angle between a projection of the second fin on the support and the edge of the support-structure is less than about 15 degrees.

20. The IC device according to claim 19, wherein the support is a die or a substrate.

\* \* \* \* \*